US010276441B2

(12) United States Patent
Lee et al.

(10) Patent No.: US 10,276,441 B2
(45) Date of Patent: Apr. 30, 2019

(54) PROTECTED CHIP-SCALE PACKAGE (CSP) PAD STRUCTURE

(71) Applicant: Taiwan Semiconductor Manufacturing Co., Ltd., Hsin-Chu (TW)

(72) Inventors: Yueh-Chuan Lee, Hsinchu (TW); Chia-Chan Chen, Zhubei (TW); Ching-Heng Liu, Miaoli County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/825,313

(22) Filed: Nov. 29, 2017

(65) Prior Publication Data

US 2019/0006237 A1    Jan. 3, 2019

Related U.S. Application Data

(60) Provisional application No. 62/527,164, filed on Jun. 30, 2017.

(51) Int. Cl.
*H01L 21/82* (2006.01)
*H01L 21/66* (2006.01)
*B23K 20/00* (2006.01)
*H01L 27/146* (2006.01)
*H01L 23/12* (2006.01)

(52) U.S. Cl.
CPC ............ *H01L 21/82* (2013.01); *B23K 20/007* (2013.01); *H01L 22/14* (2013.01); *H01L 23/12* (2013.01); *H01L 27/14621* (2013.01); *H01L 27/14627* (2013.01)

(58) Field of Classification Search
CPC .............................. H01L 21/82; H01L 23/12
See application file for complete search history.

(56) References Cited

U.S. PATENT DOCUMENTS

| 9,831,193 | B1* | 11/2017 | Jackson | ................ H01L 23/562 |
| 2007/0052106 | A1* | 3/2007 | Watase | ................ H01L 23/3114 257/774 |
| 2008/0191335 | A1* | 8/2008 | Yang | ................. H01L 27/14618 257/680 |
| 2018/0190621 | A1* | 7/2018 | Yan | ......................... H01L 24/06 |
| 2018/0226331 | A1* | 8/2018 | Sarkar | ............... H01L 23/49827 |

FOREIGN PATENT DOCUMENTS

TW          201535544 A       9/2015

* cited by examiner

*Primary Examiner* — Douglas M Menz
(74) *Attorney, Agent, or Firm* — Eschweiler & Potashnik, LLC

(57) ABSTRACT

A method for forming an integrated circuit (IC) package is provided. In some embodiments, a semiconductor workpiece comprising a scribe line, a first IC die, a second IC die, and a passivation layer is formed. The scribe line separates the first and second IC dies, and the passivation layer covers the first and second IC dies. The first IC die comprises a circuit and a pad structure electrically coupled to the circuit. The pad structure comprises a first pad, a second pad, and a bridge. The bridge is within the scribe line and connects the first pad to the second pad. The passivation layer is patterned to expose the first pad, but not the second pad, and testing is performed on the circuit through the first pad. The semiconductor workpiece is cut along the scribe line to individualize the first and second IC dies, and to remove the bridge.

20 Claims, 23 Drawing Sheets

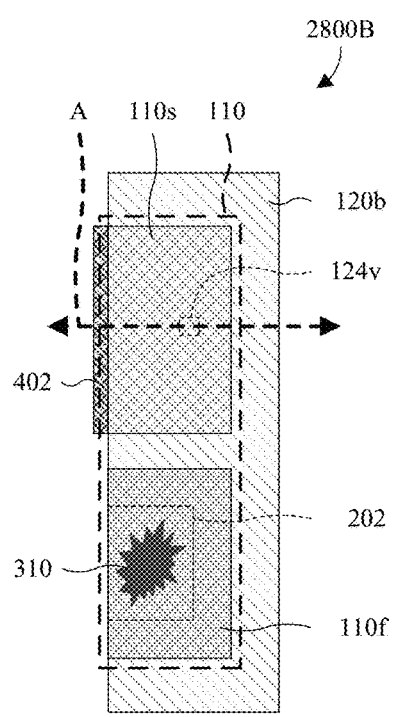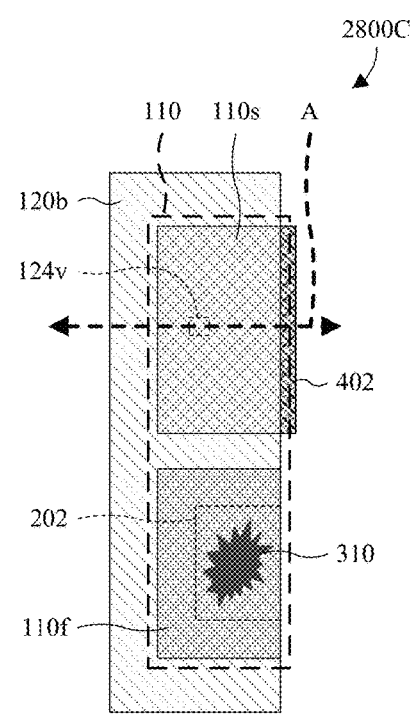
Fig. 28B        Fig. 28C

PROTECTED CHIP-SCALE PACKAGE (CSP) PAD STRUCTURE

REFERENCE TO RELATED APPLICATION

This application claims the benefit of U.S. Provisional Application No. 62/527,164, filed on Jun. 30, 2017, the contents of which are incorporated herein by reference in their entirety.

BACKGROUND

During the bulk manufacture of an integrated circuit (IC), a plurality of IC dies are formed on a semiconductor substrate. The IC dies are then separated and packaged. One process for packaging an IC die is a chip-scale packaging (CSP) process. A CSP process may be, for example, a packaging process that packages a single IC die in a direct surface mountable package that is between about 1.0-1.2 times a die area of the IC die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 28A-28C illustrate views of some embodiments of the IC package formed according to the method of FIG. 27.

DETAILED DESCRIPTION

Figure 1A:
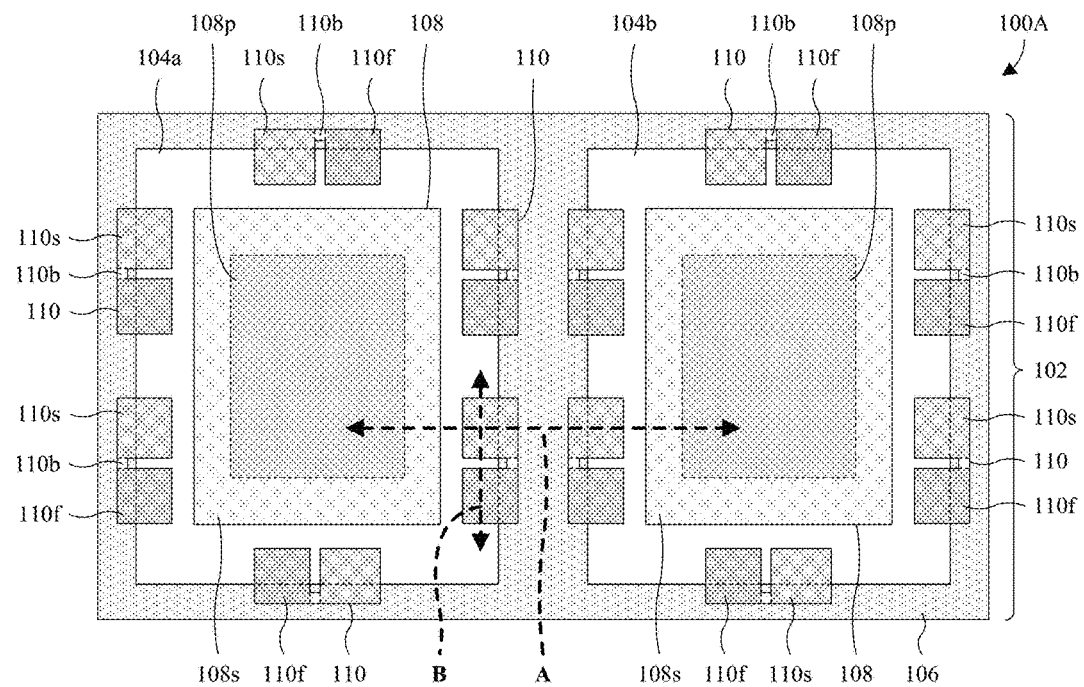
FIGS. 1A-1C through FIGS. 4A-4C illustrate a series of views of some embodiments of a method for forming an integrated circuit (IC) package using a protected chip-scale packaging (CSP) pad structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many electronic devices comprise complementary metal-oxide-semiconductor (CMOS) image sensors (CISs). According to a method for forming CIS packages, a plurality of integrated circuit (IC) dies is formed on a semiconductor substrate. Each IC die comprises an image sensing circuit and a plurality of pads. The pads extend laterally along a periphery of the IC die and are covered by a passivation layer. Further, the pads are electrically coupled to the image sensing circuit. After the IC dies are formed, openings are formed in the passivation layer to expose the pads, and a first round of circuit probe (CP) testing is performed on the image sensing circuits using the pads. Assuming the first round of CP testing is positive, an array of color filters and an array of micro-lens are formed stacked on each of the IC dies. Further, a second round of CP testing is performed using the pads. Assuming the second round of CP testing is positive, a chip-scale packaging (CSP) process is performed. The semiconductor substrate is diced to individualize the IC dies and to expose sidewalls of the pads. Further, external links are formed extending along sidewalls of the IC dies, from direct contact with the sidewalls of the pads to undersides of the IC dies.

A challenge with the method is that the pads are susceptible to corrosion and other damage once opened for the first round of CP testing. For example, chlorine ions and other contaminants produced during subsequent processing (e.g., the first round of CP testing or the formation of the color filter arrays) may corrode the pads. Damaging the pads may negatively impact the functionality and performance of the CISs. For example, the damage may increase contact resistance of the pads to a point where the image sensing circuits may fail the second round of CP testing. Further, damaging the pads may negatively impact the reliability of the CISs. For example, the external links may poorly bond to the pads due to the damage to the pads, thereby causing delamination over time. This may be exacerbated by chlorine ions or other contaminants diffusing into the external links, from the pads, and damaging the external links.

In view of the foregoing, various embodiments of the present application provide a method for forming an IC package (e.g., a CIS package) using a protected CSP pad structure. In some embodiments, a semiconductor workpiece comprising a scribe line region, a first IC die, a second IC die, and a passivation layer is formed. The scribe line region separates and adjoins the first and second IC dies, and the passivation layer covers the first and second IC dies. The first IC die comprises a circuit and a pad structure electrically coupled to the circuit. The pad structure comprises a first pad, a second pad, and a bridge. The bridge is within the scribe line region and extends from the first pad to the second pad to connect the first pad to the second pad. The passivation layer is patterned to expose the first pad, but not the second pad, and testing (e.g., CP testing) is performed on the circuit through the first pad. The semiconductor workpiece is cut along the scribe line region to individualize the first and second IC dies, and to remove the bridge, while the passivation layer covers the second pad.

Once the passivation layer is patterned to expose the first pad, the first pad is subject to corrosion and other damage during subsequent processing. However, because the second pad remains covered by the passivation layer during subsequent processing, the second pad is free or substantially free of corrosion and other damage. Further, because the cutting removes the bridge, the second pad is independent of the first pad and not affected by the damage to the first pad. Accordingly, the second pad may be used to package the first IC die without concern for corrosion and other damage. For example, an external link may be formed extending along a sidewall of the first IC, from lateral contact with the second pad, to an underside of the first IC die. This, in turn, increases the functionality and reliability of the packaged first IC die. For example, contact resistance between the second pad and the external link may be low. As another example, bonding performance between the second pad and the external link may be high.

With reference to FIGS. 1A-1C through FIGS. 4A-4C, a series of views 100A-100C through 400A-400C of some embodiments of a method for forming an IC package using a protected CSP pad structure is provided. Figures with a suffix of "A" are layout views 100A, 200A, 300A, 400A at various stages of the method. Figures with a suffix of "B" are cross-sectional views 100B, 200B, 300B, 400B taken along line A-A' in figures with a suffix of "A". Figures with a suffix of "C" are cross-sectional views 100C, 200C, 300C, 400C taken along line B-B' in figures with a suffix of "A".

As illustrated by the layout view 100A of FIG. 1A, a semiconductor workpiece 102 comprising a first IC die 104a and a second IC die 104b is formed. In some embodiments, the semiconductor workpiece 102 comprises additional IC dies (not shown). The first and second IC dies 104a, 104b are enclosed by, and laterally spaced from each other by, a scribe line region 106 of the semiconductor workpiece 102. The scribe line region 106 is a region of the semiconductor workpiece 102 through which a die saw travels to singulate the first IC die 104a and the second IC die 104b during subsequent processing.

The first and second IC dies 104a, 104b each comprise a circuit 108 and a plurality of pad structures 110. For ease of illustration, only some of the pad structures 110 are labeled 110. The circuit 108 is at a center of the IC die (e.g., 104a or 104b) and may be, for example, an image sensing circuit or some other circuit. In some embodiments, the circuit 108 comprises a pixel sensor array 108p and supporting circuitry 108s. Note that the hashing for each of the circuits 108 has been varied between the pixel sensor array 108p and the supporting circuitry 108s to make it easier to distinguish between these regions. The pixel sensor array 108p may be, for example, at a center of the circuit 108, and the supporting circuitry 108s may be, for example, at a periphery of the circuit 108. Further, the supporting circuitry 108s supports operation of the pixel sensor array 108p and may include, for example, an image signal processor (ISP), read/write circuitry, and other supporting circuitry. The pad structures 110 laterally surround the circuit 108, along a boundary of the IC die, and are partially within the scribe line region 106. Further, the pad structures 110 may be or otherwise comprise, for example, copper, aluminum, aluminum copper, some other conductive material, or any combination of the foregoing.

Each of the pad structures 110 comprises a first pad 110f, a second pad 110s, and a bridge 110b. For ease of illustration, the first pad 110f is only labeled 110f for some of the pad structures 110, the second pad 110s is only labeled 110s for some of the pad structures 110, and the bridge 110b is only labeled 110b for some of the pad structures 110. Further, the hashing for each of the pad structures 110 has been varied between the first pad 110f, the second pad 110s, and the bridge 110b to make it easier to distinguish between these regions of the pad structure. Notwithstanding this, it is to be understood that the first pad 110f, the second pad 110s, and the bridge 110b may, for example, be continuous (e.g., formed from a common deposition or a common piece of material). As will become clear hereafter, the first pad 110f may also be referred to as a CP pad, and the second pad 110s may also be referred to as a package pad. The first and second pads 110f, 110s are laterally spaced along a boundary of an IC die (e.g., 104a or 104b), and the bridge 110b extends from the first pad 110f to the second pad 110s, along the boundary, to electrically couple the first and second pads 110f, 110s. Further, whereas the first and second pads 110f, 110s are at least partially outside of the scribe line region 106, the bridge 110b is completely within the scribe line region 106. In some embodiments, each of the pad structures 110 has a U-shaped layout or some other layout.

Figure 1B:
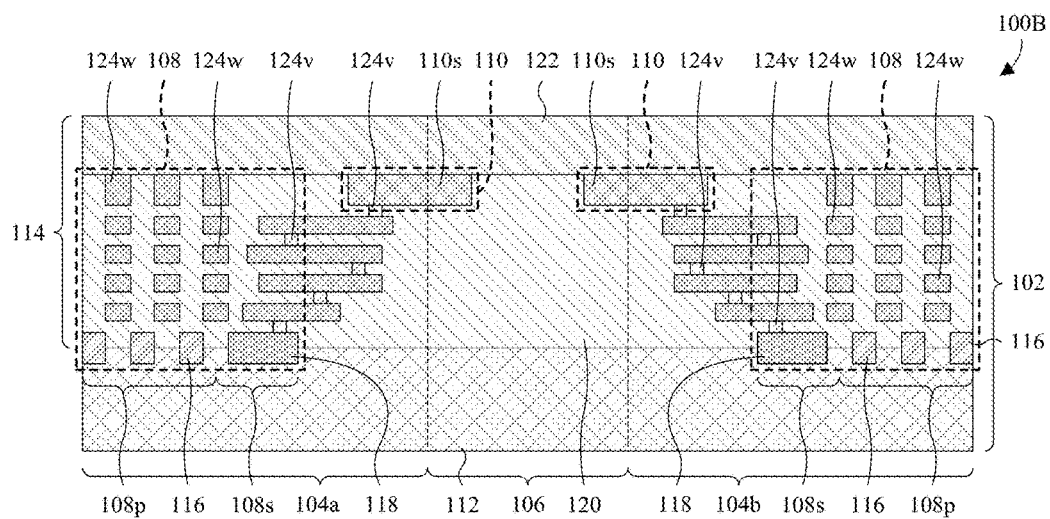

As illustrated by the cross-sectional view 100B of FIG. 1B, the semiconductor workpiece 102 comprises a semiconductor substrate 112 and an interconnect structure 114. The semiconductor substrate 112 and the interconnect structure 114 accommodate and at least partially define the circuits 108. For example, the semiconductor substrate 112 may at least partially define semiconductor devices of the circuits 108, and the interconnect structure 114 may interconnect the semiconductor devices of the circuits 108. The semiconductor devices may include, for example, transistors, photodiodes, and other semiconductor devices.

In some embodiments in which the circuits 108 comprise the pixel sensor arrays 108p, the circuits 108 comprise a plurality of pixel sensors 116 arranged in rows and columns to define the pixel sensor arrays 108p. For ease of illustration, only some of the pixel sensors 116 are labeled 116. The pixel sensors 116 may be, for example, active pixel sensors (APSs) or some other type of pixel sensor. Further, in some embodiments in which the circuits 108 comprise the supporting circuitry 108s, the circuits 108 comprise a plurality of supporting devices 118 to at least partially define the supporting circuitry 108s. The supporting devices 118 may be or otherwise include, for example, metal-oxide-semiconductor (MOS) field-effect transistors (MOFSETs), insulated-gate field-effect transistors (IGFETs), some other type of transistor, some other type of semiconductor device, or any combination of the foregoing.

The semiconductor substrate 112 underlies the interconnect structure 114 and may be, for example, a bulk silicon substrate, a silicon-on-insulator (SOI) substrate, or some other type of semiconductor substrate. The interconnect structure 114 comprises an interlayer dielectric (ILD) layer 120 and a passivation layer 122 covering the ILD layer 120. The ILD layer 120 may be or otherwise comprise, for example, silicon dioxide, a low κdielectric, some other dielectric, or any combination of the foregoing. As used herein, a low κdielectric is a dielectric with a dielectric constant κless than about 3.9, 3.0, 2.0, or 1.0. The passivation layer 122 may be or otherwise comprise, for example, silicon dioxide, silicon nitride, some other dielectric, or any combination of the foregoing. The interconnect structure 114 further comprise a plurality of conductive features.

The conductive features and the pad structures 110 are stacked within the ILD layer 120 and the passivation layer 122. The conductive features define conductive paths interconnecting devices of the circuit 108 (e.g., the pixel sensors 116 and/or the supporting devices 118), and further electrically coupling the pad structures 110 to the circuit 108. In some embodiments, the conductive features electrically couple directly to the second pads 110s of the pad structures 110, and indirectly to the first pads 110f of the pad structures 110 (see FIG. 1A) through the second pads 110s and the bridges 110b of the pad structures 110 (see FIG. 1A). The conductive features include wires 124w and vias 124v. For ease of illustration, only some of the wires 124w are labeled 124w, and only some of the vias 124v are labeled 124v. The wires 124w and/or the vias 124v are or otherwise comprise copper, aluminum, aluminum copper, tungsten, some other conductive material, or any combination of the foregoing.

Figure 1C:
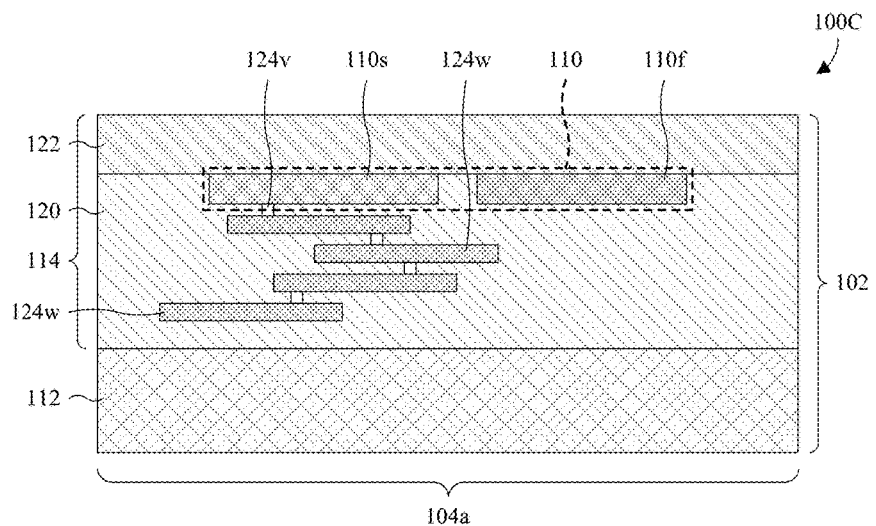

As illustrated by the cross-sectional view 100C of FIG. 1C, the first and second pads 110f, 110s of a pad structure 110 are covered by the passivation layer 122. The pad structure 110 may, for example, be representative of each other pad structure in FIGS. 1A and 1B. Because the passivation layer 122 covers the first and second pads 110f, 110s, the first and second pads 110f, 110s are protected from an ambient environment of the semiconductor workpiece 102, which may corrode or otherwise damage the first and second pads 110f, 110s.

Figure 2A:
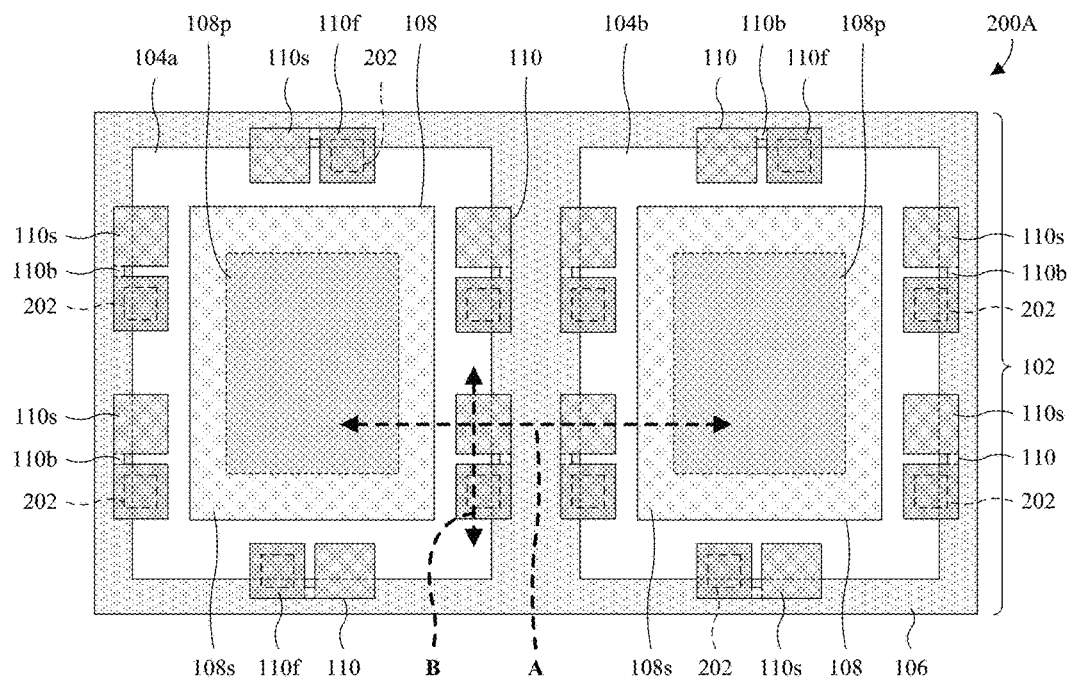
Figure 2B:
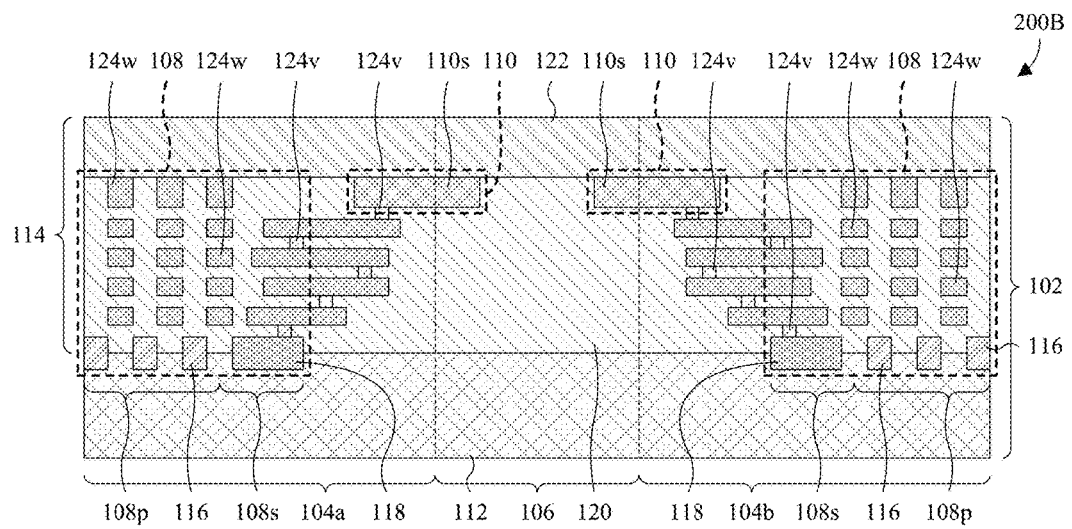
Figure 2C:
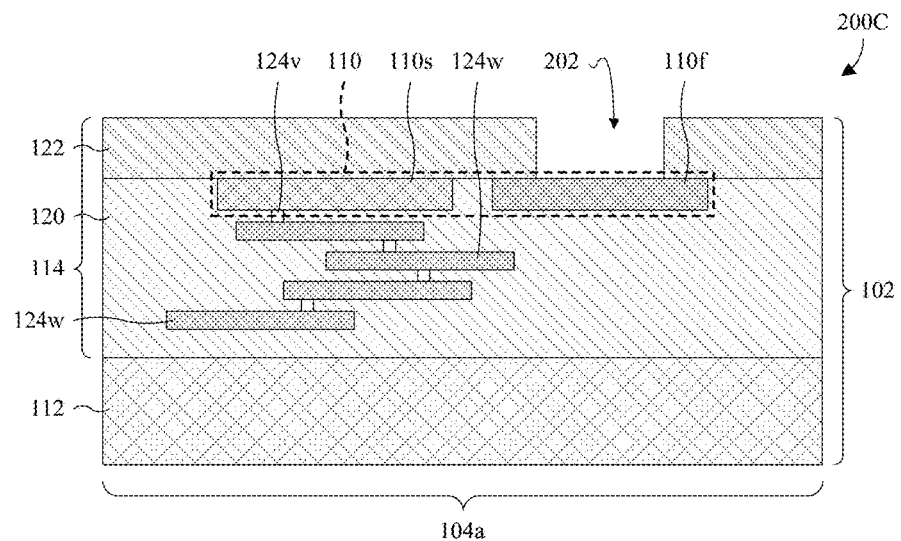

As illustrated by the views 200A-200C of FIGS. 2A-2C, CP openings 202 (see FIG. 2A or 2C) are formed in the passivation layer 122 (see FIGS. 2B and 2C) to expose the first pads 110f of the pad structures 110 without exposing the second pads 110s of the pad structures 110. For ease of illustration, only some of the CP openings 202 are labeled 202. In some embodiments, the CP openings 202 comprise a CP opening for each of the first pads 110f, and/or the CP openings 202 overlap the scribe line region 106. Further, in some embodiments, the CP openings 202 are formed by photolithography and an etching process.

In some embodiments, after the CP openings 202 are formed, a first round of CP testing is performed on the circuits 108 using the first pads 110f of the pad structures 110. Depending upon results of the first round of CP testing, the semiconductor workpiece 102 is scrapped or reworked, or proceeds to subsequent processing described hereafter. Further, in some embodiments, the first pads 110f corrode or otherwise become damaged during the first round of CP testing due to exposure to an ambient environment of the semiconductor workpiece 102. For example, the first pads 110f may oxidize due to such exposure. Even though the first pads 110f corrode or otherwise become damaged, the second pads 110s of the pad structures 110 remain undamaged and corrosion free because the second pads 110s remain covered by the passivation layer 122 during the first round of CP testing.

Figure 3A:
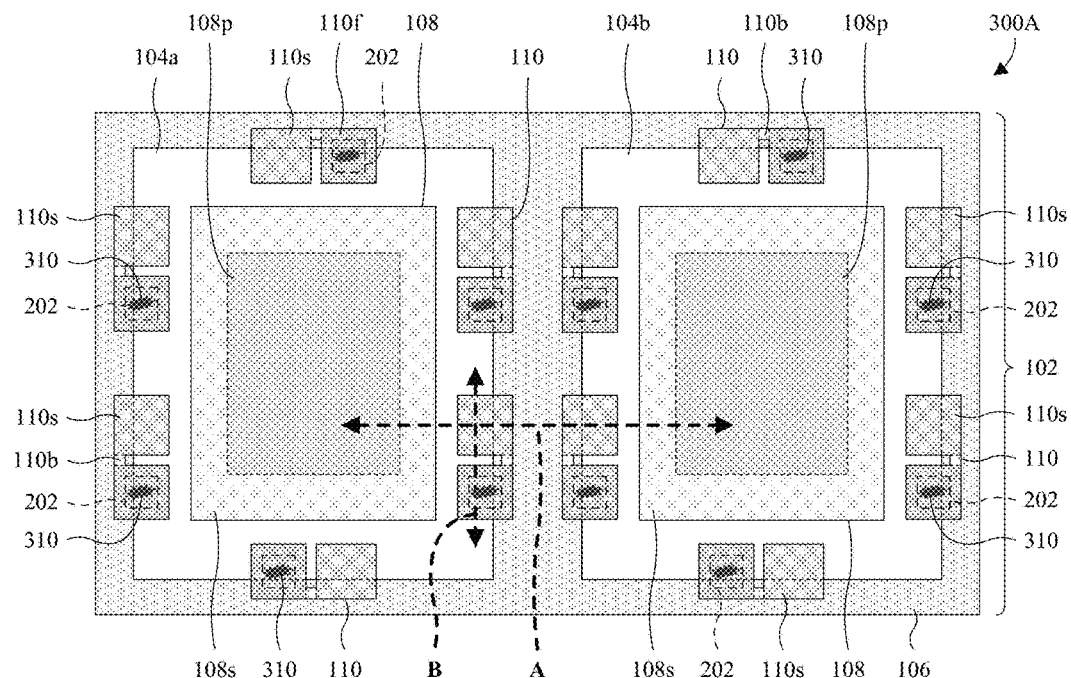
Figure 3B:
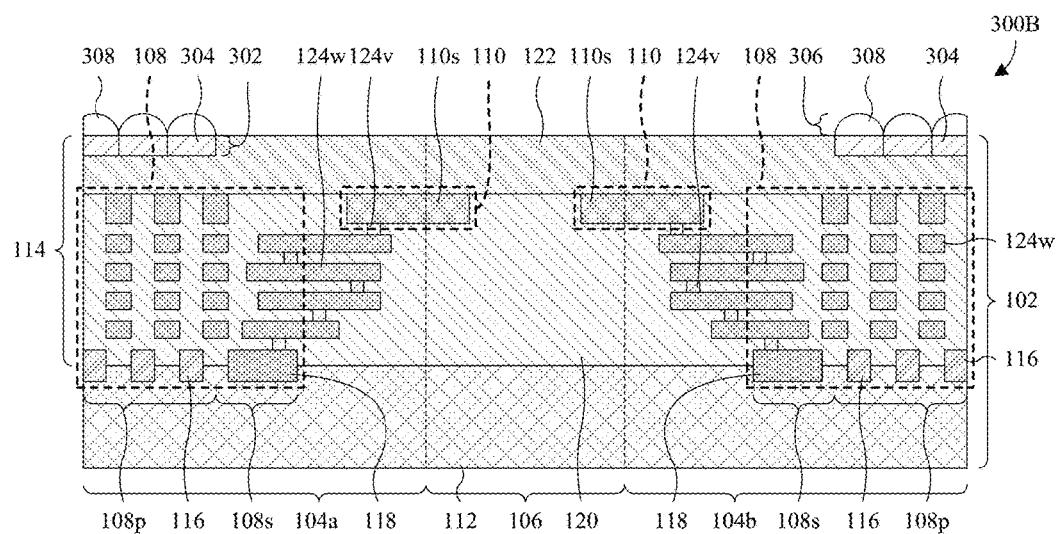
Figure 3C:
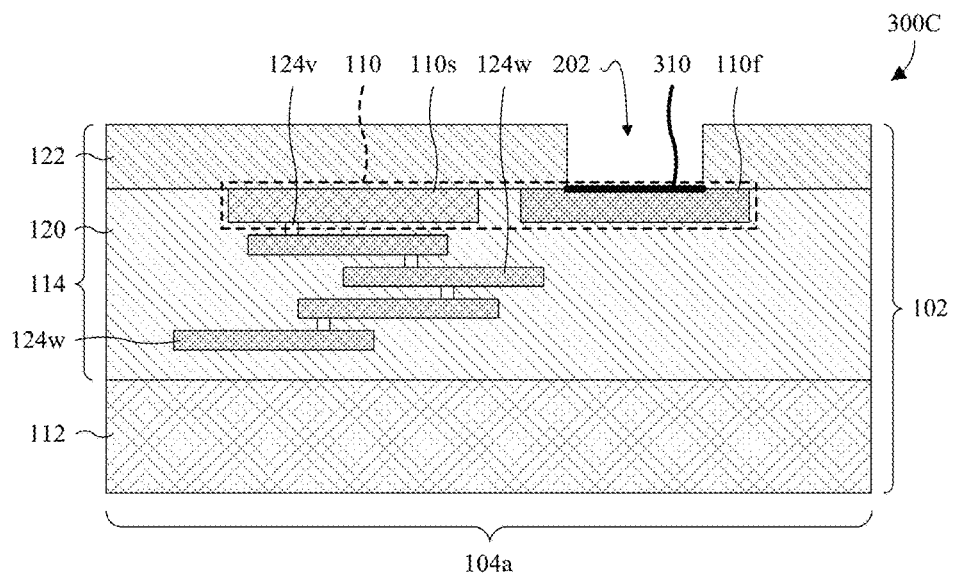

As illustrated by the views 300A-300C of FIGS. 3A-3C, in some embodiments, an array 302 of color filters 304 (see FIG. 3B) and an array 306 of micro-lenses 308 (see FIG. 3B) are formed stacked on the passivation layer 122, overlying each of the pixel sensor arrays 108p. For ease of illustration, only some of the color filters 304 are labeled 304, and only some of the micro-lenses 308 are labeled 308. Further, for ease of illustration, the array 302 of color filters 304 is only labeled 302 for one of the pixel sensor arrays 108p, and the array 306 of micro-lenses 308 is only labeled 306 for one of the pixel sensor arrays 108p.

Further, in some embodiments, after the array 302 of color filters 304 and the array 306 of micro-lenses 308 are formed, a second round of CP testing is performed on the circuits 108 using the first pads 110f of the pad structures 110. Depending upon results of the second round of CP testing, the semiconductor workpiece 102 is scrapped or reworked, or proceeds to subsequent processing described hereafter.

Also illustrated by the views 300A-300C of FIGS. 3A-3C, damage 310 (see FIGS. 3A and 3C) forms on the first pads 110f of the pad structures 110 through the CP openings 202. The damage 310 may include, for example, corrosion and other damage. In some embodiments, the damage 310 forms during the first round of CP testing, the second round of CP testing, while forming the array 302 of color filters 304 (see FIG. 3B) and the array 306 of micro-lenses 308 (see FIG. 3B), or any combination of the foregoing. For example, the process for forming the array 302 of color filters 304 and an array 306 of micro-lenses 308 may use chlorine gas that causes the damage 310. Because the second pads 110s of the pad structures 110 were not exposed by the CP openings 202 for CP testing and remain covered by the passivation layer 122, the second pads 110s remain undamaged and corrosion free.

Figure 4A:
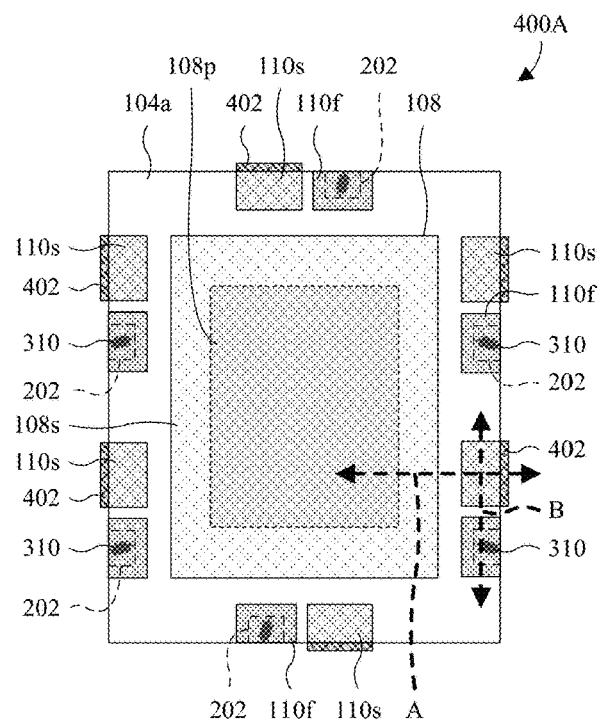
Figure 4B:
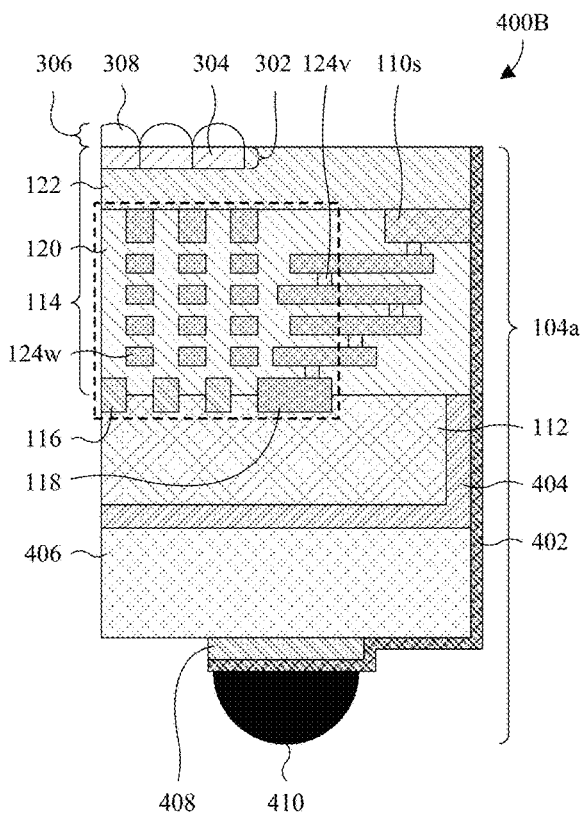
Figure 4C:
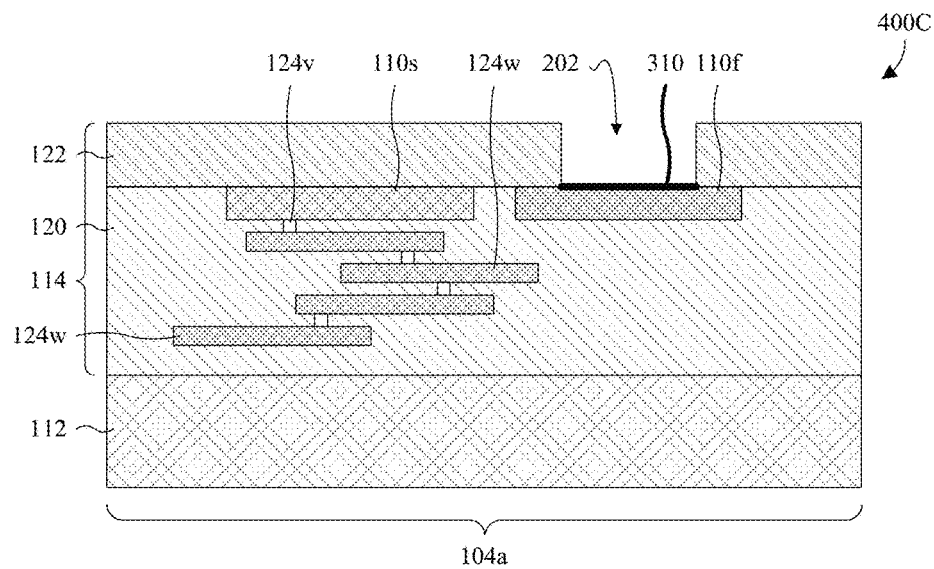

As illustrated by the views 400A-400C of FIGS. 4A-4C, a CSP process is performed to package the first and second IC dies 104a, 104b (see FIGS. 3A-3C). For ease of illustration, only the first IC die 104a is shown. The CSP process includes singulating the first and second IC dies 104a, 104b by cutting the semiconductor workpiece 102 (see FIGS. 3A-3C) along the scribe line region 106 (see FIG. 3A-3C). The singulation removes the bridges 110b of the pad structures 110 (see FIGS. 3A-3C), thereby physically and electrically separating the first pads 110f from the second pads 110s. The singulation may, for example, be performed by a die saw or some other cutting tool. In some embodiments, processes performed between the singulation and the second round of CP testing further cause corrosion or damage to the first pads 110f.

Additionally, the CSP process includes, for each of at least some (e.g., all) of the second pads 110s, forming an external link 402 (see FIGS. 4A and 4B) extending along a sidewall of a corresponding IC die (e.g., the first IC die 104a or the second IC die 104b), from lateral contact with a sidewall of the second pad to an underside of the corresponding IC die. For ease of illustration, the external link 402 is only labeled 402 for some of the second pads 110s. Further, for ease of illustration, the process by which the external link 402 is formed is described hereafter with respect to a different series of figures. The external link 402 may be, for example, aluminum copper, aluminum, copper, some other metal, or some other conductive material.

By separating the first pads 110f from the second pads 110s, the first pads 110f are electrically floating. Further, the second pads 110s may be used during the CSP process without concern for damage or other damage. The second pads 110s are covered by the passivation layer 122 and, hence, are free of corrosion and other corrosion. Further, because the second pads 110s are separated from the first pads 110f, the second pads 110s are not affected by the damage 310 on the first pads 110f. Accordingly, contact resistance with the second pads 110s is low, and the bond strength between the second pads and the external links 402 is high. This, in turn, enhances the functionality and reliability of the first and second IC dies 104a, 104b.

In some embodiments, the external links 402 are electrically insulated from sidewalls of the semiconductor substrate 112 by an adhesive layer 404 lining the sidewalls laterally between the semiconductor substrate 112 and each of the external links 402. The adhesive layer 404 may be, for example, a dielectric epoxy or some other dielectric adhesive. Further, in some embodiments, the adhesive layer 404 secures a lower insulating plate 406 to the underside of the semiconductor substrate 112, such that the adhesive layer 404 is vertically between the lower insulating plate 406 and the semiconductor substrate 112. The lower insulating plate 406 may be, for example, transparent, and/or may be, for example, glass or some other insulating material. In some embodiments, the external links 402 each extend along a sidewall of the lower insulating plate 406, and laterally along an underside of the lower insulating plate 406 to vertically between a barrier element 408 and a conductive bump 410 on the underside. The barrier element 408 blocks material of the conductive bump 410 from migrating to the lower insulating plate 406 and may be, for example, silicon oxide, silicon nitride, or some other dielectric. The conductive bump 410 is electrically coupled to one of the second pads 110s through a corresponding external links and may be, for example, solder or some other conductive material.

Figure 5:
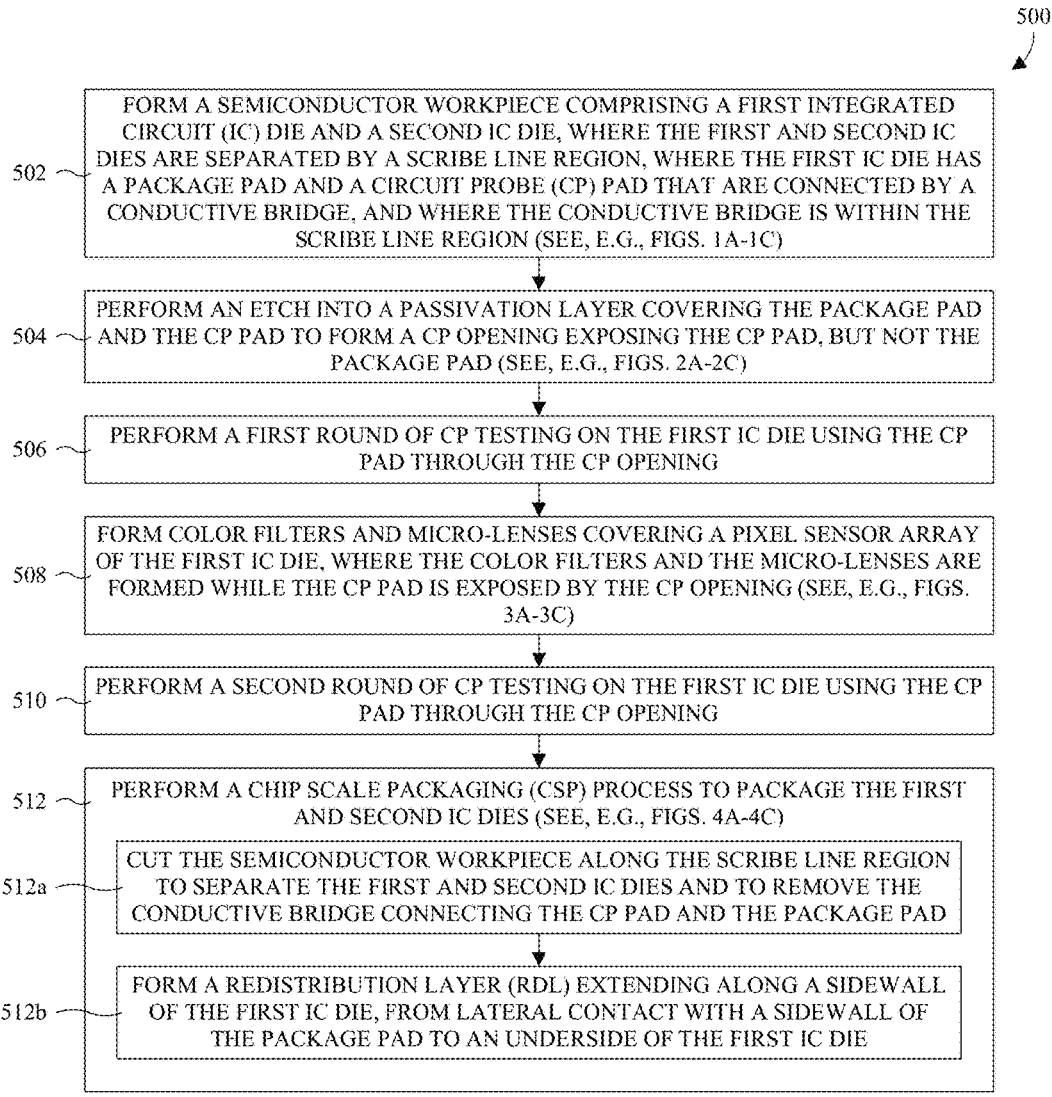
FIG. 5 illustrates a flowchart of some embodiments of the method of FIGS. 1A-1C through FIGS. 4A-4C.

With reference to FIG. 5, a flowchart 500 of some embodiments of the method of FIGS. 1A-1C through FIGS. 4A-4C is provided.

At 502, a semiconductor workpiece comprising a first IC die and a second IC die is formed. The first and second IC dies are separated by a scribe line region and may be or otherwise comprise, for example, CISs. The first IC die has a package pad and a CP pad that are connected by a conductive bridge. Further, the conductive bridge is within the scribe line region. See, for example, FIGS. 1A-1C.

At 504, an etch is performed into a passivation layer covering the package pad and the CP pad to form a CP opening exposing the CP pad, but not the package pad. See, for example, FIGS. 2A-2C.

At 506, a first round of CP testing is performed on the first IC die using the CP pad through the CP opening.

At 508, color filters and micro-lenses are formed covering a pixel sensor array of the first IC die. The color filters and the micro-lenses are formed while the CP pad is exposed by the CP opening. See, for example, FIGS. 3A-3C.

At 510, a second round of CP testing is performed on the first IC die using the CP pad through the CP opening.

At 512, a CSP process is performed to package the first and second IC dies. See, for example, FIGS. 4A-4C. The CSP process includes, at 512a, cutting the semiconductor workpiece along the scribe line region to separate the first and second IC dies and to remove the conductive bridge connecting the CP pad and the package pad. Further, the CSP process includes, at 512b, forming an external link extending along a sidewall of the first IC die, from lateral contact with a sidewall of the package pad to an underside of the first IC die.

The CP pad is used for CP testing after being exposed by the CP opening, while the package pad remains covered by the passivation layer and, hence, free of corrosion and other damage. Further, the cutting separates the CP and package pads, such that the package pad may be used during the CSP process without concern for corrosion or other damage. This may, in turn, may enhance the functionality and the reliability of the first and second IC dies, and may, in turn, enhance bonding performance between the package pad and the external link.

While the flowchart 500 of FIG. 5 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 6-9, 10A, 10B, 11, 12A, 12B, 13-19, 20A, 20B, and 21-26, a series of views 600-900, 1000A, 1000B, 1100, 1200A, 1200B, 1300-1900, 2000A, 2000B, 2100-2600 of some more detailed embodiments of a method for forming an IC package using a protected CSP pad structure is provided.

Figure 6:
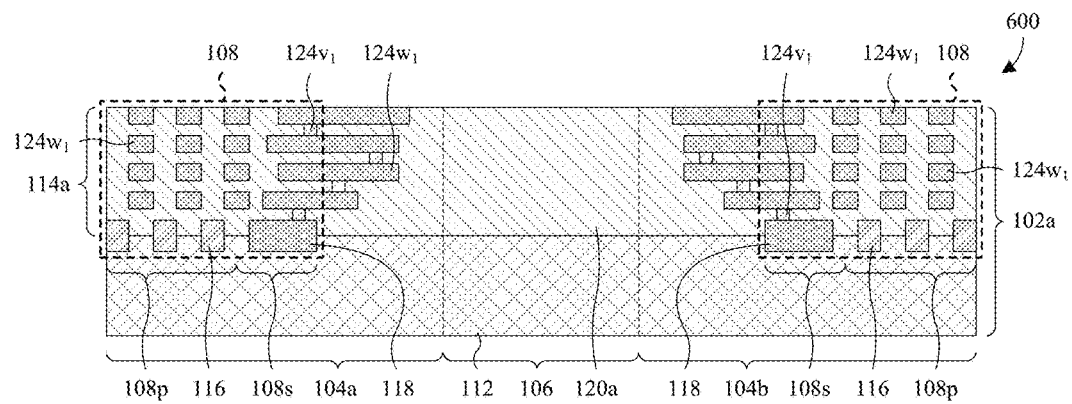
FIGS. 6-9, 10A, 10B, 11, 12A, 12B, 13-19, 20A, 20B, and 21-26 illustrate a series of views of some more detailed embodiments of the method of FIGS. 1A-1C through 4A-4C.

As illustrated by the cross-sectional view 600 of FIG. 6, a semiconductor workpiece 102a comprising a first IC die 104a and a second IC die 104b is provided. The first and second IC dies 104a, 104b are laterally spaced from each other by a scribe line region 106, and each comprises a circuit 108. In some embodiments, the circuit 108 comprises a pixel sensor array 108p and supporting circuitry 108s. The pixel sensor array 108p may, for example, comprise a plurality of pixel sensors 116 arranged in rows and columns. For ease of illustration, only some of the pixel sensors 116 are labeled 116. The supporting circuitry 108s supports operation of the pixel sensor array 108p and may comprise, for example, a plurality of supporting devices 118.

The semiconductor workpiece 102a further comprises a semiconductor substrate 112 and an interconnect structure 114a. The semiconductor substrate 112 and the interconnect structure 114a accommodate and at least partially define the circuits 108. For example, the semiconductor substrate 112 may at least partially define devices of the circuits 108 (e.g., the pixel sensors 116 and/or the supporting devices 118), and the interconnect structure 114a may interconnect the devices of the circuits 108. The interconnect structure 114a overlies the semiconductor substrate 112, and comprises a lower ILD layer 120a and a plurality of conductive features. The lower ILD layer 120a may be or otherwise comprise, for example, silicon dioxide, a low κ dielectric, some other dielectric, or any combination of the foregoing. The conductive features are stacked within the lower ILD layer 120 and define conductive paths interconnecting the devices of the circuits 108. The conductive features include first wires $124w_1$ and first vias $124v_1$. For ease of illustration, only some of the first wires $124w_1$ are labeled $124w_1$, and only some of the first vias $124v_1$ are labeled $124v_1$.

Figure 7:
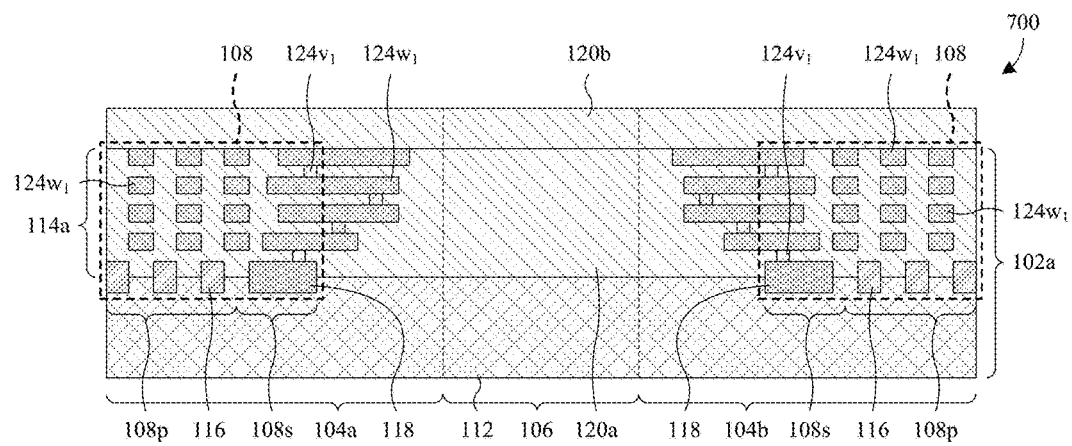

As illustrated by the cross-sectional view 700 of FIG. 7, an upper ILD layer 120b is formed covering the lower ILD layer 120a. Further, the upper ILD layer 120b is formed with a top surface that is planar or substantially planar. The upper ILD layer 120b may be or otherwise comprise, for example, silicon dioxide, a low κ dielectric, some other dielectric, or any combination of the foregoing. In some embodiments, a process for forming the upper ILD layer 120b comprises depositing the upper ILD layer 120b on the lower ILD layer 120a, and subsequently performing a planarization into a top of the upper ILD layer 120b to flatten the top surface of the upper ILD layer 120b. The deposition may, for example, be performed by chemical vapor deposition (CVD), physical vapor deposition (PVD), sputtering, or some other deposition process. The planarization may, for example, be performed by a chemical mechanical polish (CMP) or some other planarization process.

Figure 8:
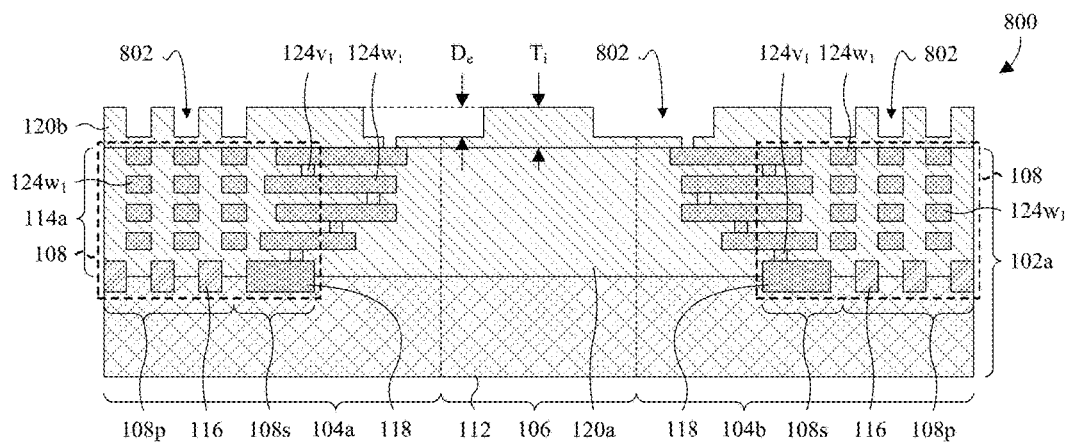

As illustrated by the cross-sectional view 800 of FIG. 8, the upper ILD layer 120b is patterned to define a plurality of feature openings 802 with a layout of additional conductive features (e.g., pad structures, vias, and wires) under manufacture. For ease of illustration, only some of the feature openings 802 are labeled 802. Further, the feature openings 802 expose conductive features along a bottom surface of the upper ILD layer 120b. In some embodiments, the patterning is performed by one or more photolithography/etching processes. For example, a first photoresist mask (not shown) may be formed on the upper ILD layer 120b using photolithography, and a first etch may be performed into the upper ILD layer 120 with the first photoresist mask in place. The first etch may extend into the upper ILD layer 120b to a depth $D_e$ that is less than a thickness $T_i$ of the upper ILD layer 120b to partially form the feature openings 802. Thereafter, the first photoresist mask may be stripped and a second photoresist mask (not shown) may be formed on the upper ILD layer 120b using photolithography. Further, a second etch may be performed into the upper ILD layer 120 with the second photoresist mask in place, and the second photoresist mask may thereafter be stripped. The second etch extends into the upper ILD layer 120b, through the feature openings 802 as partially formed, to expand the feature openings 802 and to expose the conductive features along the bottom surface of the upper ILD layer 120b.

Figure 9:
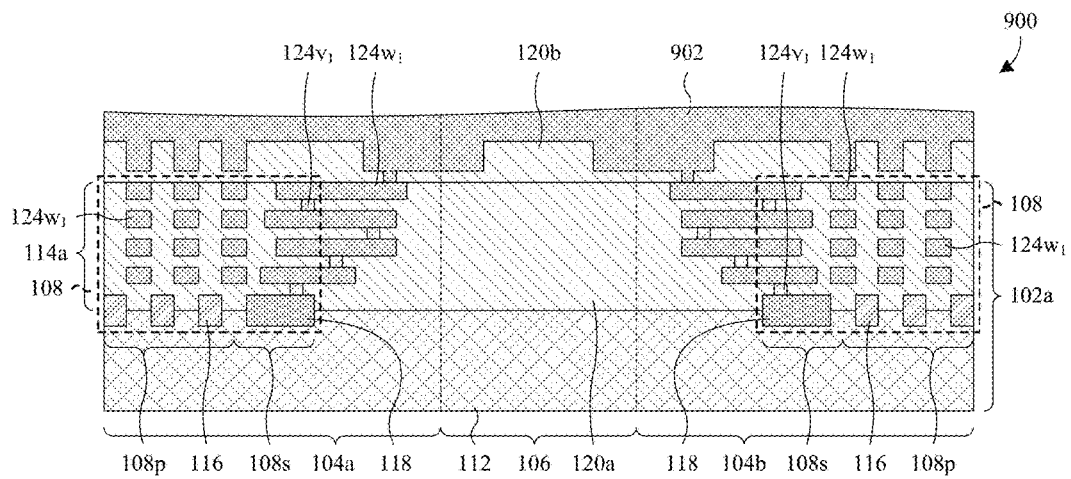

As illustrated by the cross-sectional view 900 of FIG. 9, a first conductive layer 902 is formed covering the upper ILD layer 120b and filling the feature openings 802 (see FIG. 8). The first conductive layer 902 may be, for example, aluminum copper, copper, aluminum, some other metal, some other conductive material, or any combination of the foregoing. Further, the first conductive layer 902 may be formed by, for example, CVD, PVD, sputtering, electroless plating, electroplating, some other deposition or plating process, or any combination of the foregoing.

Figure 10A:
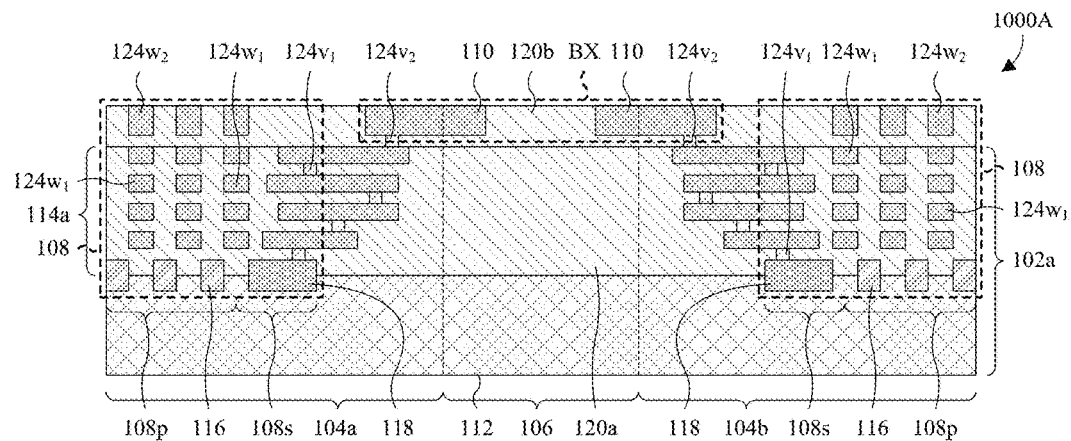
Figure 10B:
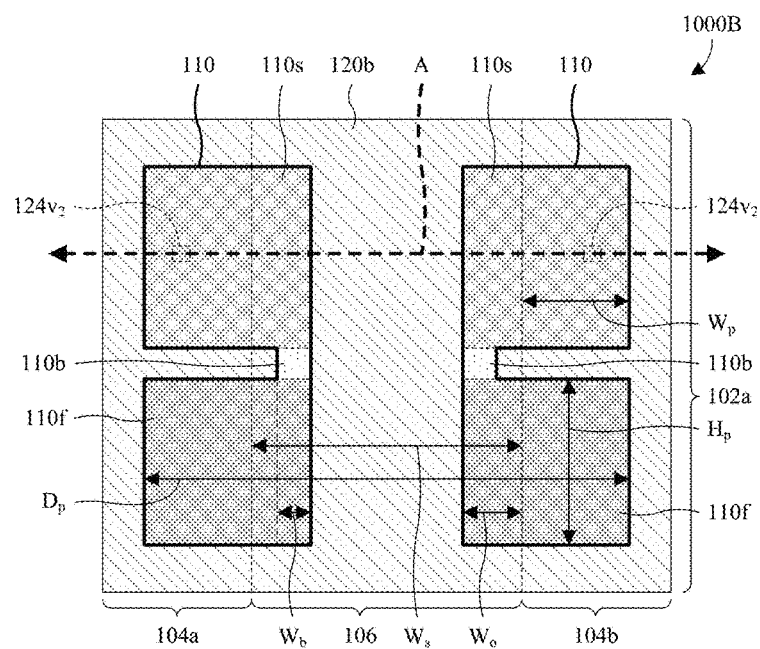

As illustrated by the views 1000A, 1000B of FIGS. 10A and 10B, a planarization is performed into the first conductive layer 902 (see FIG. 9) to about even with a top surface of the upper ILD layer 120b. FIG. 10A provides a cross-sectional view 1000A along line A in FIG. 10B, and FIG. 10B provides a top view 1000B within box BX in FIG. 10A. Further, although not described with FIGS. 10A and 10B, FIG. 1A may, for example, be representative of the broader layout of the structure in FIGS. 10A and 10B. The planarization forms a plurality of additional conductive features within the feature openings 802 (see FIG. 8), and may, for example, be performed by a CMP or some other planarization process.

The additional conductive features include second wires $124w_2$, pad structures 110, and second vias $124v_2$. For ease of illustration, only some of the second wires $124w_2$ are labeled $124w_2$. The pad structures 110 are electrically coupled to the circuits 108 by underlying conductive features, which may include, for example, at least some of the first and/or second vias $124v_1$, $124v_2$, and/or at least some of the first and/or second wires $124w_1$, $124w_2$. As seen in FIG. 10B, each of the pad structures 110 comprises a first pad 110f, a second pad 110s, and a bridge 110b. For ease of illustration, the hashing has been varied between the first pad 110f, the second pad 110s, and the bridge 110b to make it easier to distinguish between these regions of the pad structures 110. Notwithstanding this, it is to be understood that the first pad 110f, the second pad 110s, and the bridge 110b are continuous (e.g., formed from a common piece of material) within each of the pad structure 110.

The first and second pads 110f, 110s for each of the pad structure 110 are laterally spaced along a boundary of a corresponding IC die (e.g., 104a or 104b), and the bridge 110b of the pad structure extends from the first pad 110f to the second pad 110s to electrically couple the first and second pads 110f, 110s. Further, whereas the first and second pads 110f, 110s are at least partially outside the scribe line region 106, the bridge 110b is completely within the scribe line region 106. As such, during singulation (e.g., cutting or dicing) of the first and second IC dies 104a, 104b, the bridge 110b is completely removed, whereas the first and second pads 110f, 110s are only partially removed.

In some embodiments, the bridges 110b of the pad structures 110 each have a bridge width $W_b$ between about 5-10 micrometers, about 5-20 micrometers, about 10-20 micrometers, or about 10-30 micrometers. For example, the bridge width $W_b$ may be about 20 micrometers. In some embodiments, the scribe line region 106 has a scribe line width $W_s$ between about 100-140 micrometers, about 110-130 micrometers, or about 75-150 micrometers. For example, the scribe line width $W_s$ may be about 120 micrometers. Further, in some embodiments, the pad structures 110 each overlap the scribe line region 106 with an overlapping pad width $W_o$ between about 10-30 micrometers, about 15-25 micrometers, or about 5-50 micrometers. For example, the overlapping pad width $W_o$ may be about 20 micrometers, and/or may be the same as, or greater than, the bridge width $W_b$. In some embodiments, the first and second pads 110f, 110s of the pad structures 110 each have an effective pad width $W_p$ between about 50-100 micrometers, about 80-100 micrometers, about 85-95 micrometers, or about 75-125 micrometers, and/or have a pad height $H_p$ between about 40-80 micrometers, 50-70 micrometers, or about 50-120 micrometers. For example, the effective pad width $W_p$ may be about 90 or 120 micrometers, and the pad height $H_p$ may be about 60 micrometers, or vice versa. The effective pad width $W_p$ is a total width of a first or second pad less the overlapping pad width $W_o$. In some embodiments, the pad-to-pad distance $D_p$ between neighboring pad structures respectively of the first and second IC dies 104a, 104b is about 250-350 micrometers, about 290-310 micrometers, or about 275-325 micrometers. The pad-to-pad distance $D_p$ may be, for example, the scribe line width $W_s$ plus two times the effective pad width $W_p$.

Note that while FIGS. 7-9, 10A, 10B, and 11 illustrated a dual-damascene-like process for forming the second wires $124w_2$, the pad structures 110, and the second vias $124v_2$, another dual-damascene-like process or a single-damascene-like process may alternatively be employed. A dual-damascene-like process and a single-damascene-like process are respectively dual-damascene and single damascene processes that are not limited to copper.

Figure 11:
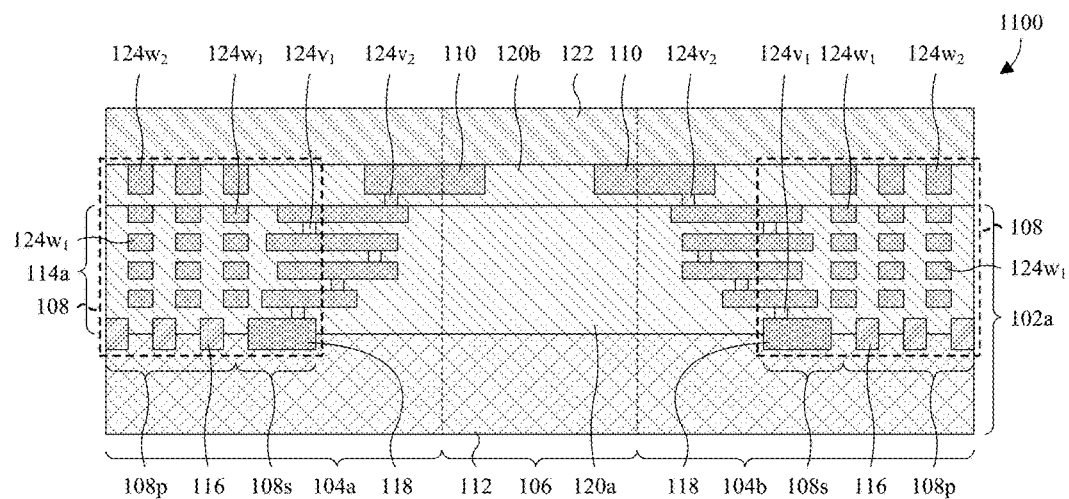

As illustrated by the cross-sectional view 1100 of FIG. 11, an upper passivation layer 122 is formed covering the upper ILD layer 120b, the second wires $124w_2$, the pad structures 110, and the second vias $124v_2$. Further, the upper passivation layer 122 is formed with a top surface that is planar or substantially planar. The upper passivation layer 122 may be, for example, silicon dioxide, silicon nitride, some other dielectric, or any combination of the foregoing. In some embodiments, a process for forming the upper passivation layer 122 comprises depositing the upper passivation layer 122 on the upper ILD layer 120b, and subsequently performing a planarization into the upper passivation layer 122 to flatten the top surface of the upper passivation layer 122. The deposition may, for example, be performed by CVD, PVD, sputtering, or some other deposition process. The planarization may, for example, be performed by a CMP or some other planarization process.

Figure 12A:
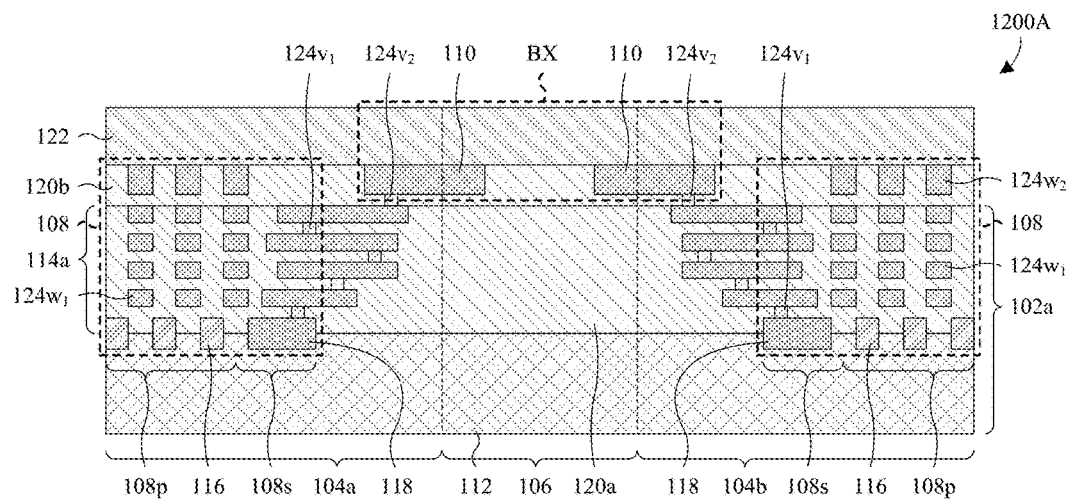
Figure 12B:
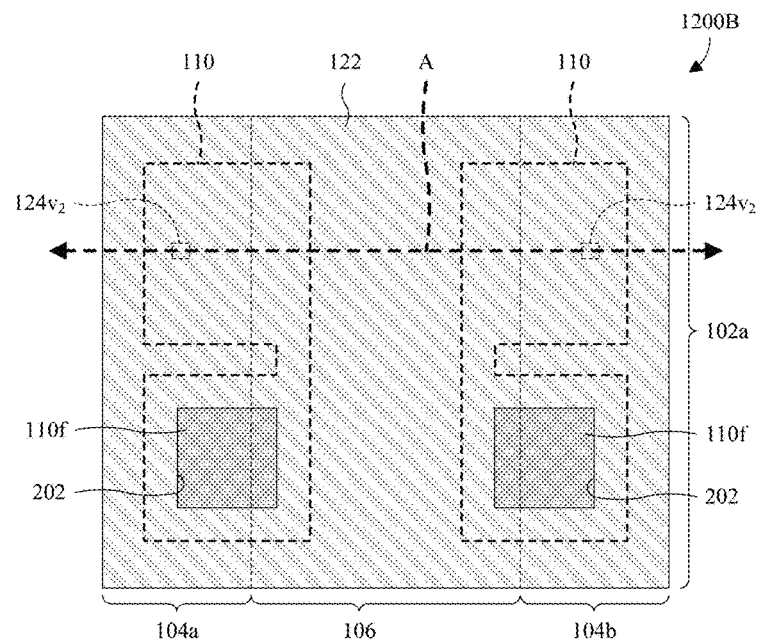

As illustrated by the views 1200A, 1200B of FIGS. 12A and 12B (best seen in FIG. 12B), the upper passivation layer 122 is patterned to form CP openings 202 overlying and exposing the first pads 110f (see FIG. 12B) of the pad structures 110. FIG. 12A provides a cross-sectional view 1200A along line A in FIG. 12B, and FIG. 12B provides a top view 1200B within box BX in FIG. 12A. Further, although not described with FIGS. 12A and 12B, FIG. 2A may, for example, be representative of the broader layout of the structure in FIGS. 12A and 12B. In some embodiments, the patterning is performed by a photolithography/etching processes. For example, a photoresist mask (not shown) may be formed on the upper passivation layer 122, and an etch may be performed into the upper passivation layer 122 with the photoresist mask in place. The photoresist mask may, for example, have a layout of the CP openings 202 and may, for example, be formed using photolithography. The etch extends through the upper passivation layer 122 and stops on the first pads 110*f* of the pad structures 110.

In some embodiments, after the CP openings 202 are formed, a first round of CP testing is performed on the circuits 108 using the first pads 110*f* of the pad structures 110. Depending upon results of the first round of CP testing, the semiconductor workpiece 102*a* is scrapped or reworked, or proceeds to subsequent processing described hereafter. Further, in some embodiments, the first pads 110*f* corrode or otherwise become damaged during the first round of CP testing due to exposure to an ambient environment of the semiconductor workpiece 102*a*. For example, the first pads 110*f* may oxidize due to such exposure.

Figure 13:
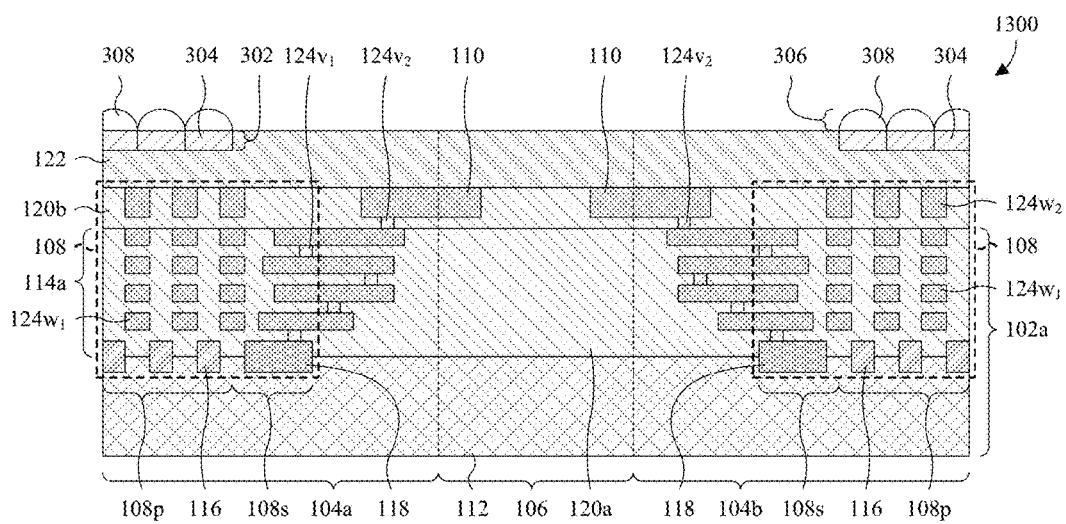

As illustrated by the cross-sectional view 1300 of FIG. 13, in some embodiments, an array 302 of color filters 304 and an array 306 of micro-lenses 308 are formed stacked on the upper passivation layer 122, overlying each of the pixel sensor arrays 108*p*. For ease of illustration, only some of the color filters 304 are labeled 304, and only some of the micro-lenses 308 are labeled 308. Further, for ease of illustration, the array 302 of color filters 304 is only labeled 302 for one of the pixel sensor arrays 108*p*, and the array 306 of micro-lenses 308 is only labeled 306 for one of the pixel sensor arrays 108*p*.

Further, in some embodiments, after the array 302 of color filters 304 and the array 306 of micro-lenses 308 are formed, a second round of CP testing is performed on the circuits 108 using the first pads 110*f* of the pad structures 110 (see FIG. 12B). Depending upon results of the second round of CP testing, the semiconductor workpiece 102*a* is scrapped or reworked, or proceeds to subsequent processing described hereafter. In some embodiments, the first pads 110*f* corrode or otherwise become damaged while forming the array 302 of color filters 304 and the array 306 of micro-lenses 308, and/or during the second round of CP testing, due to exposure to an ambient environment of the semiconductor workpiece 102*a*. For example, chlorine ions used while forming the color filters 304 an the micro-lenses 308 may damage the first pads 110*f*.

Figure 14:
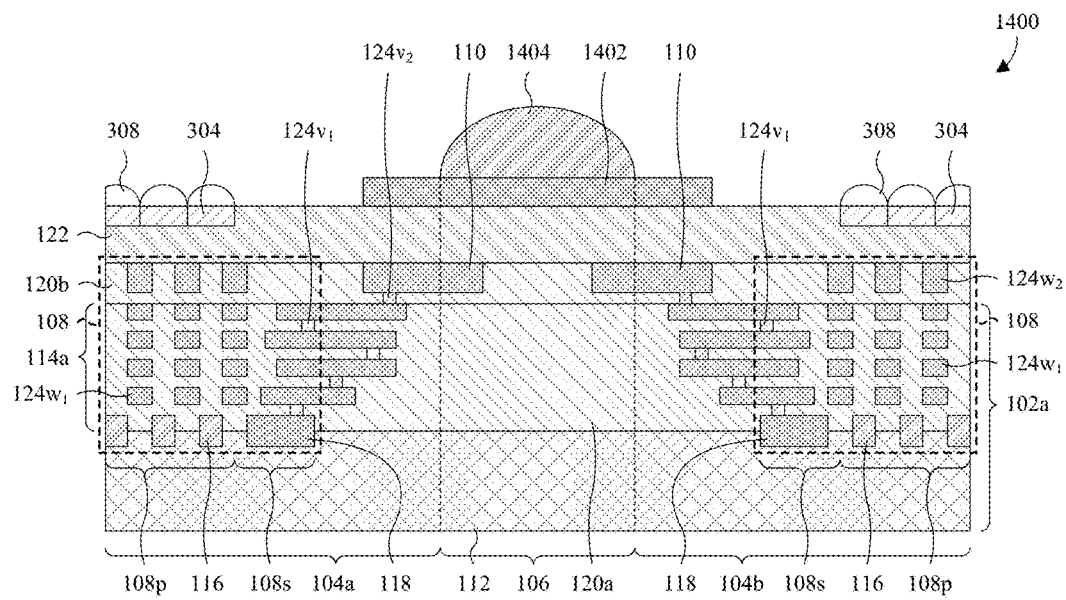

As illustrated by the cross-sectional view 1400 of FIG. 14, a dam layer 1402 is formed on the upper passivation layer 122, overlying the scribe line region 106. The dam layer 1402 is dielectric and may be, for example, photoresist or some other dielectric material. Further, the dam layer 1402 may, for example, have a ring-shaped layout (not visible in the cross-sectional view 1400) with a pair of ring-shaped segments respectively encircling the first and second IC dies 104*a*, 104*b*. In some embodiments, a process for forming the dam layer 1402 comprises depositing the dam layer 1402 and subsequently patterning the dam layer. The depositing may, for example, be performed by spin coating or some other deposition process, and/or the patterning may, for example, be performed using photolithography.

Also illustrated by the cross-sectional view 1400 of FIG. 14, an upper adhesive layer 1404 is formed overlying the dam layer 1402. The upper adhesive layer 1404 may be, for example, an epoxy or some other adhesive. Further, the upper adhesive layer 1404 may, for example, have the same, or substantially the same, layout as the dam layer 1402. In some embodiments, the upper adhesive layer 1404 is formed by a printing process or some other deposition process.

Figure 15:
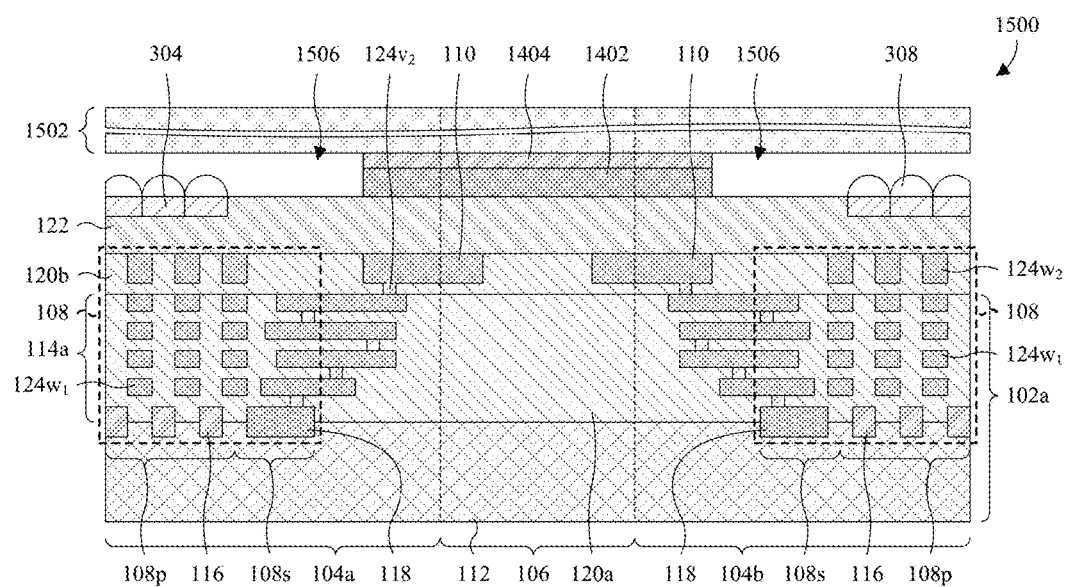

As illustrated by the cross-sectional view 1500 of FIG. 15, an upper insulating plate 1502 is bonded to the upper passivation layer 122 through the dam layer 1402 and the upper adhesive layer 1404. The upper adhesive layer 1404 adheres the upper insulating plate 1502 to upper passivation layer 122 through the dam layer 1402. The upper insulating plate 1502 is transparent and may be, for example, glass or some other insulating material. Although not visible in the cross-sectional view 1500, in some embodiments, the bonding seals (e.g., hermetically sales) a cavity 1506 overlying each of the circuits 108.

Figure 16:
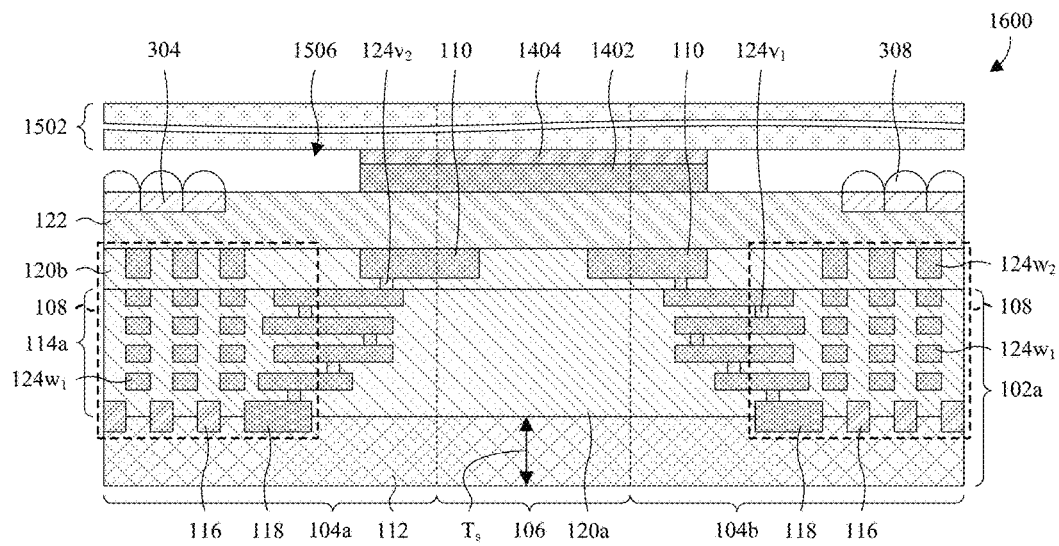

As illustrated by the cross-sectional view 1600 of FIG. 16, the semiconductor substrate 112 is thinned to reduce a thickness $T_s$ of the semiconductor substrate 112. In some embodiments, the semiconductor substrate 112 is thinned by a CMP, some other planarization process, or some other thinning process.

Figure 17:
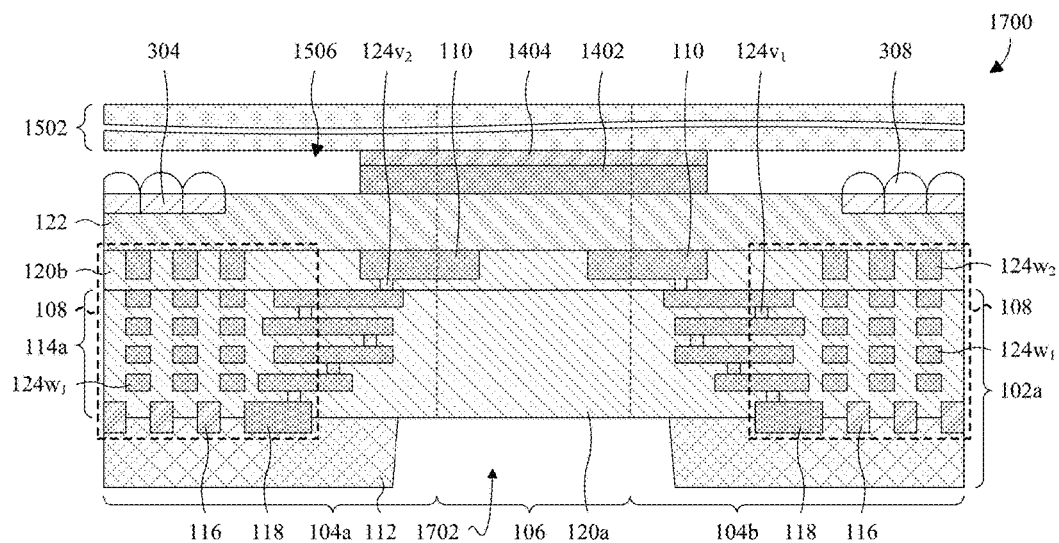

As illustrated by the cross-sectional view 1700 of FIG. 17, the semiconductor substrate 112 is patterned to define a scribe line opening 1702 in the scribe line region 106. The scribe line opening 1702 exposes the lower ILD layer 120*a* and may, for example, be confined to the scribe line region 106. In some embodiments, the patterning is performed by a photolithography/etching processes. For example, a photoresist mask (not shown) may be formed on the semiconductor substrate 112, and an etchant may thereafter be applied to the semiconductor substrate 112 through the photoresist mask. The photoresist mask may be formed by, for example, depositing a photoresist layer on the semiconductor substrate 112 and patterning the photoresist layer with a layout of the scribe line opening 1702. The depositing may, for example, be performed by spin coating or some other deposition process, and/or the patterning may, for example, be performed by photolithography. Thereafter, the photoresist mask may be stripped. The etchant may have a high etch rate for the semiconductor substrate 112, relative to the lower ILD layer 120*a*, such that the lower ILD layer 120*a* serves as an etch stop.

Figure 18:
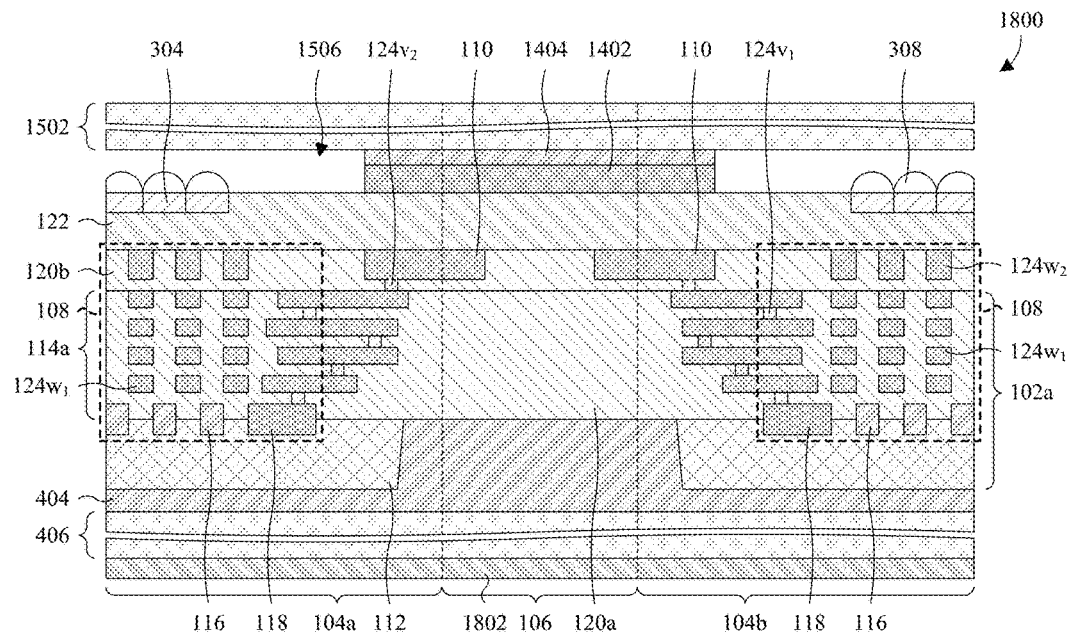

As illustrated by the cross-sectional view 1800 of FIG. 18, a lower adhesive layer 404 is formed on the semiconductor substrate 112, and further filling the scribe line opening 1702 (see FIG. 17). The lower adhesive layer 404 may, for example, be an epoxy or some other adhesive. In some embodiments, the lower adhesive layer 404 is formed by a printing process or some other deposition process.

Also illustrated by the cross-sectional view 1800 of FIG. 18, a lower insulating plate 406 is bonded to the semiconductor substrate 112 through the lower adhesive layer 404. The lower insulating plate 406 may, for example, be transparent, and/or may, for example, be glass or some other insulating material.

Also illustrated by the cross-sectional view 1800 of FIG. 18, a barrier layer 1802 is formed on the lower insulating plate 406, such that the lower insulating plate 406 vertically spaces the barrier layer 1802 from the lower adhesive layer 404. The barrier layer 1802 may be, for example, silicon oxide, silicon nitride, or some other dielectric, and/or may, for example, be formed by CVD, PVD, or some other deposition process.

Figure 19:
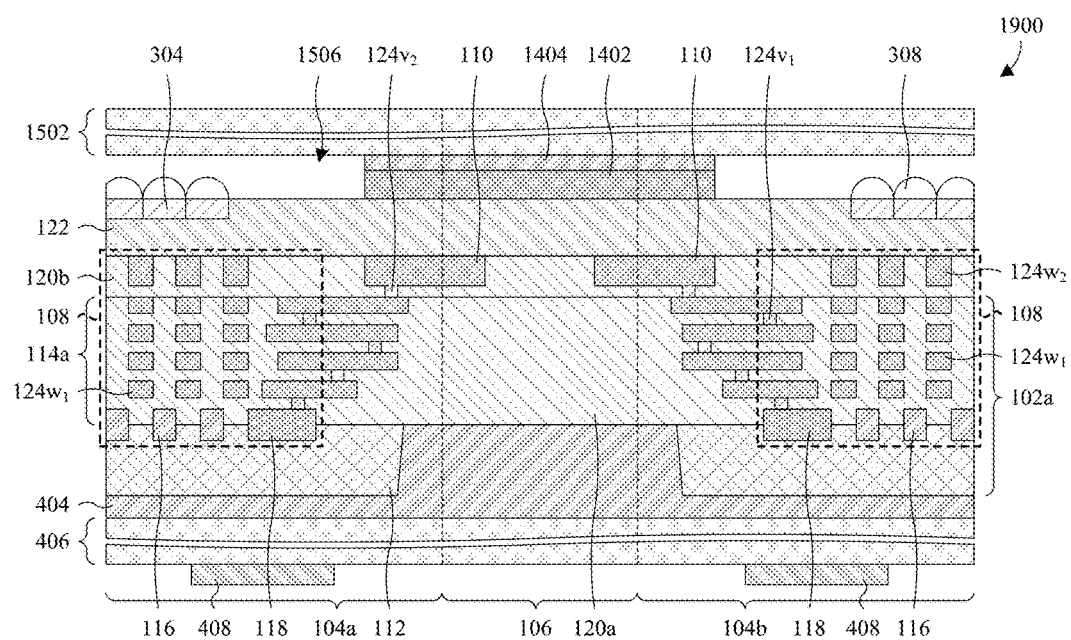

As illustrated by the cross-sectional view 1900 of FIG. 19, the barrier layer 1802 (see FIG. 18) is patterned to form a pair of barrier elements 408 respectively under the circuits 108, on the lower insulating plate 406. As seen hereafter, the barrier elements 408 correspond to conductive bumps (or balls) formed hereafter. In some embodiments, the patterning is performed by a photolithography/etching processes. For example, a photoresist mask (not shown) may be formed on the barrier layer 1802, and an etchant may thereafter be applied to the barrier layer 1802 through the photoresist mask. The photoresist mask may, for example, be formed by depositing a photoresist layer on the barrier layer 1802 and patterning the photoresist layer with a layout of barrier elements 408. The depositing may, for example, be performed by spin coating or some other deposition process, and/or the patterning may, for example, be performed by photolithography. Thereafter, the photoresist mask may be stripped. The etchant may have a high etch rate for the barrier layer 1802, relative to the lower insulating plate 406, such that the lower insulating plate 406 serves as an etch stop.

Figure 20A:
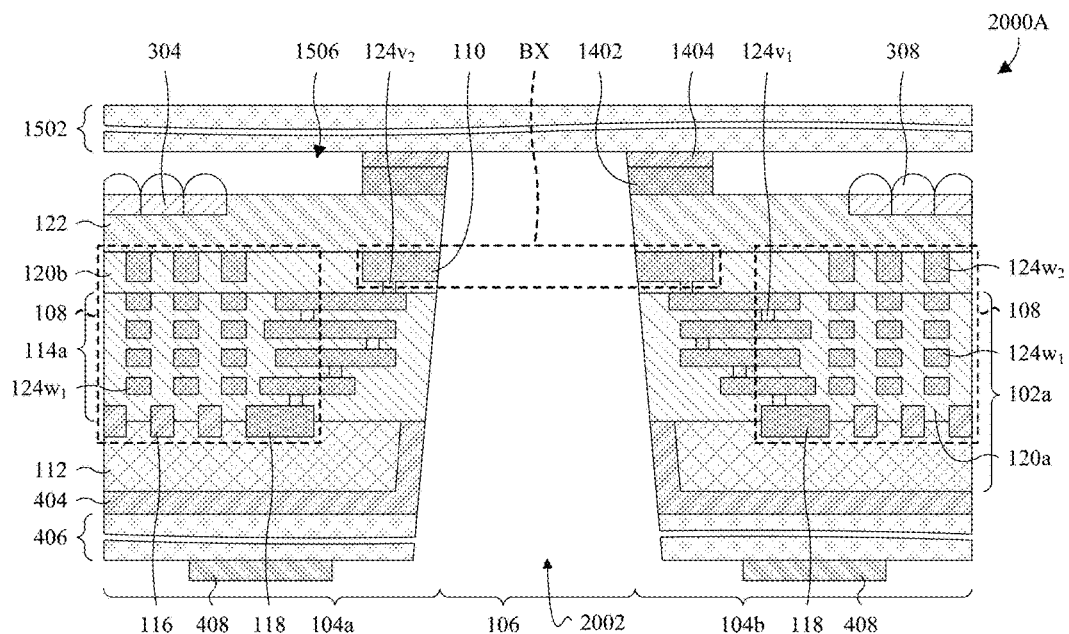
Figure 20B:
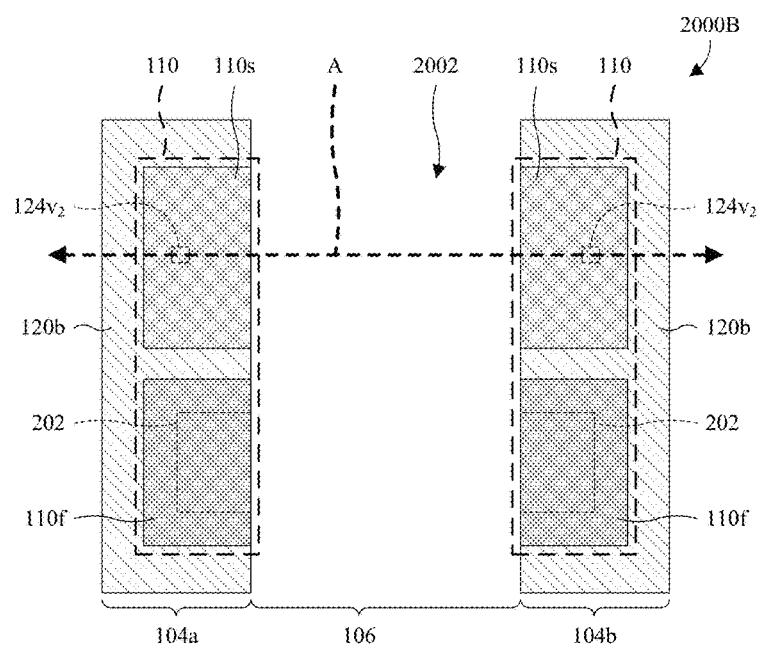

As illustrated by the views 2000A, 2000B of FIGS. 20A and 20B, the lower adhesive layer 404, the lower insulating plate 406, the semiconductor workpiece 102a, the upper ILD layer 122b, the upper passivation layer 122, the pad structures 110, the dam layer 1402, and the upper adhesive layer 1404 are cut along the scribe line region 106 to define a notch 2002 overlapping with the scribe line region 106. FIG. 20A provides a cross-sectional view 2000A along line A in FIG. 20B, and FIG. 20B provides a top view 2000B taken within box BX in FIG. 20A. Further, although not described with FIGS. 20A and 20B, FIG. 4A may, for example, be representative of the broader layout of each of the first and second IC dies 104a, 104b upon completion of the cutting. The cutting singulates/individualizes the first and second IC dies 104a, 104b and may be, for example, performed by a die saw or some other cutting tool. Further, the cutting removes the bridges 110b of the pad structures 110 (see FIG. 10B) to physically and electrically separate the first pads 110f from the second pads 110s.

By separating the first pads 110f from the second pads 110s, the first pads 110f are electrically floating. Further, because the second pads 110s are separated from the first pads 110f, the second pads 110s are not affected by damage on the first pads 110f. Such damage may occur during preceding processes through the CP openings 202. Further yet, because the second pads 110s remained covered by the upper passivation layer 122 during the preceding processes, the second pads 110s are free of corrosion and other damage.

Figure 21:
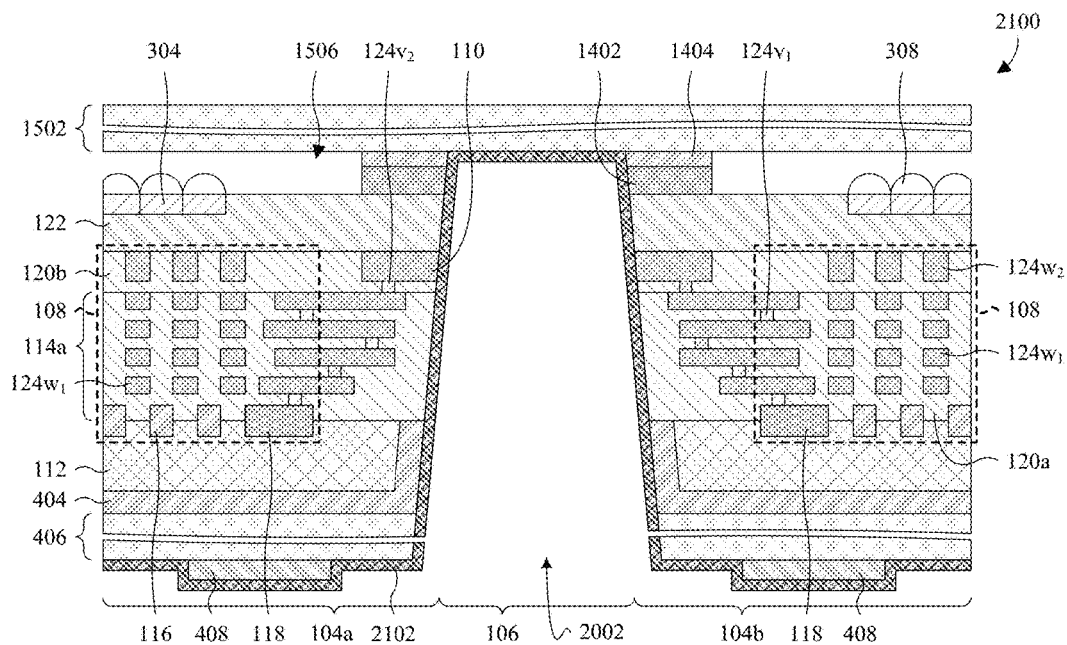

As illustrated by the cross-sectional view 2100 of FIG. 21, a second conductive layer 2102 is formed lining the barrier elements 408 and the notch 2002, and further laterally contacting sidewalls of the pad structures 110. The second conductive layer 2102 may be or comprise, for example, aluminum copper, copper, aluminum, some other metal, or some other conductive material. The second conductive layer 2102 may, for example, be formed conformally, and/or may, for example, be formed by CVD, PVD, electroless plating, electroplating, or some other deposition or plating process.

Figure 22:
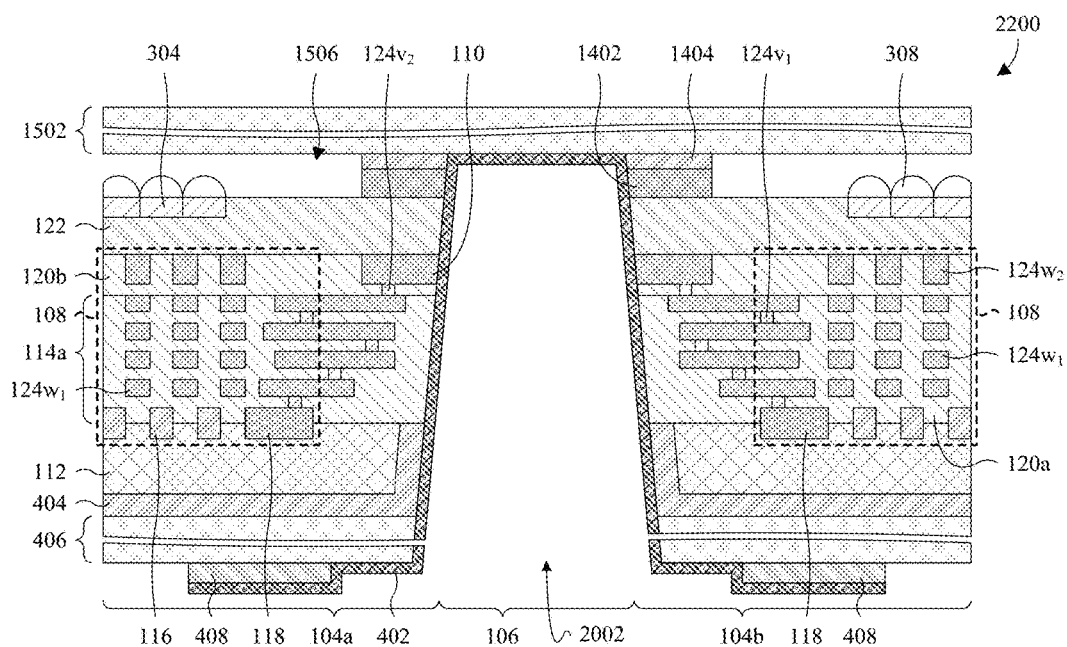

As illustrated by the cross-sectional view 2200 of FIG. 22, the second conductive layer 2102 (see FIG. 21) is patterned to define a external link 402 extending from one of the barrier elements 408 corresponding to the first IC die 104a, along sidewalls of the notch 2002 and sidewalls of the pad structures 110, to another one of the barrier elements 408 corresponding to the second IC die 104b. In some embodiments, the patterning is performed by a photolithography/etching processes. For example, a photoresist mask (not shown) may be formed on the second conductive layer 2102, and an etchant may thereafter be applied to the second conductive layer 2102 through the photoresist mask. The photoresist mask may, for example, be formed by depositing a photoresist layer on the second conductive layer 2102 and patterning the photoresist layer with a layout of the external link 402. The depositing may, for example, be performed by spin coating or some other deposition process, and/or the patterning may, for example, be performed by photolithography. Thereafter, the photoresist mask may be stripped.

Figure 23:
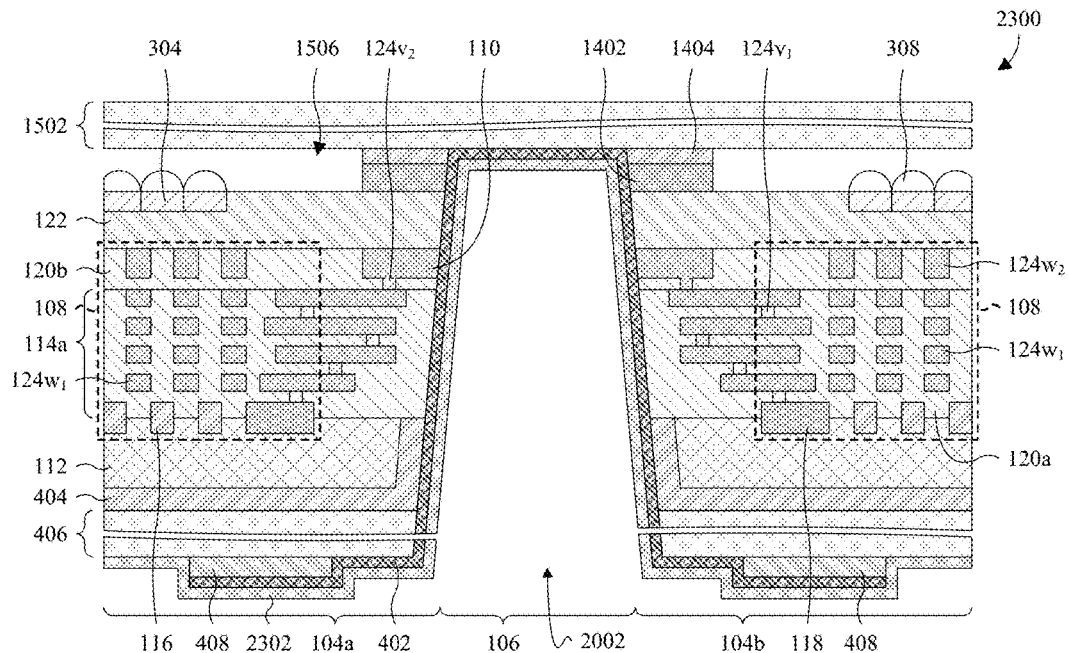

As illustrated by the cross-sectional view 2300 of FIG. 23, a lower passivation layer 2302 is formed lining the notch 2002 on the external link 402, and further lining the lower insulating plate 406 and the barrier elements 408. The lower passivation layer 2302 may be or otherwise comprise, for example, silicon nitride, silicon oxide, or some other dielectric. The lower passivation layer 2302 may, for example, formed by CVD, PVD, or some other deposition process.

Figure 24:
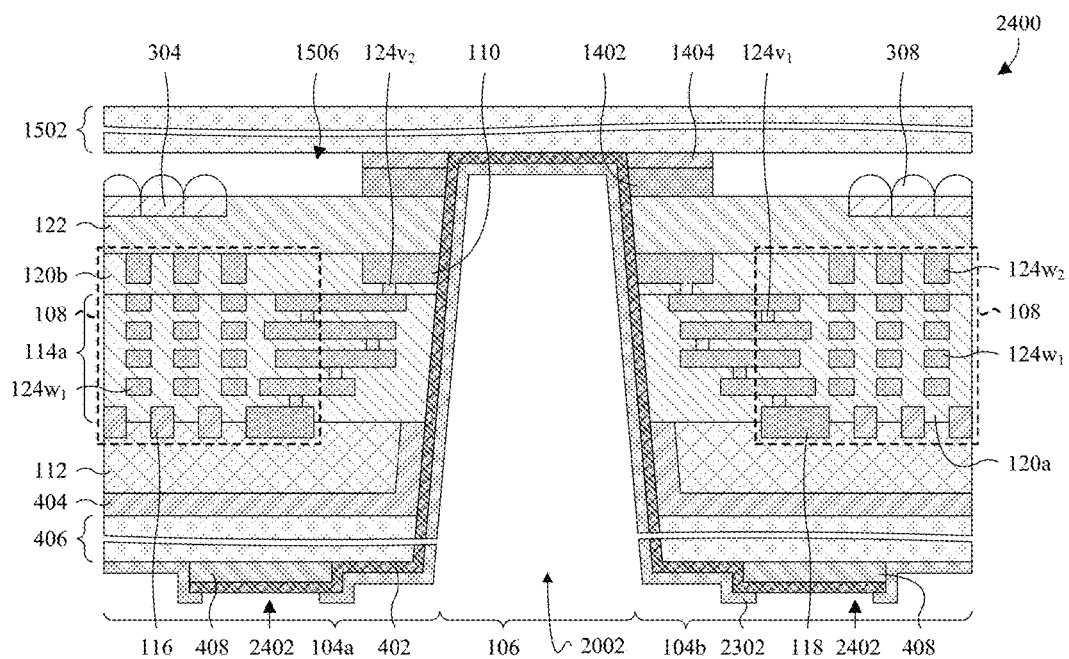

As illustrated by the cross-sectional view 2400 of FIG. 24, the lower passivation layer 2302 is patterned to define barrier openings 2402 respectively exposing portions of the external link 402 on the barrier elements 408. In some embodiments, the patterning is performed by a photolithography/etching processes. For example, a photoresist mask (not shown) may be formed on the lower passivation layer 2302, and an etchant may thereafter be applied to the lower passivation layer 2302 through the photoresist mask. The photoresist mask may, for example, be formed by depositing a photoresist layer on the lower passivation layer 2302 and patterning the photoresist layer with a layout of the barrier openings 2402. The depositing may, for example, be performed by spin coating or some other deposition process, and/or the patterning may, for example, be performed by photolithography. Thereafter, the photoresist mask may be stripped.

Figure 25:
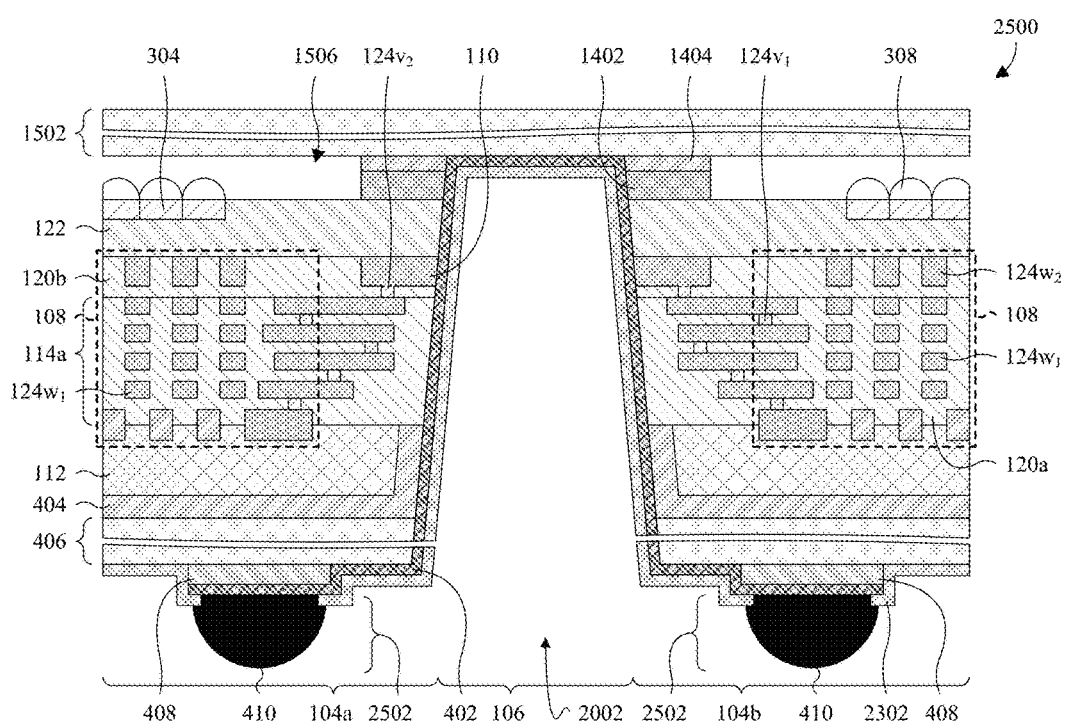

As illustrated by the cross-sectional view 2500 of FIG. 25, conductive bumps 410 are formed on the external link 402, within the barrier openings 2402 (see FIG. 24), to define a BGA 2502 underlying each of the circuits 108. The conductive bumps 410 are may be, for example, solder or some other conductive material, and/or may be formed by, for example, depositing solder in the barrier openings 2402 and subsequently performing reflow process to reform the deposited solder into the conductive bumps 410. The conductive bumps 410 are electrically coupled to the external link 402, and are further electrically coupled to the pad structures 110 through the external link 402. Further yet, the conductive bumps 410 are electrically coupled to the circuits 108 through the pad structures 110.

Figure 26:
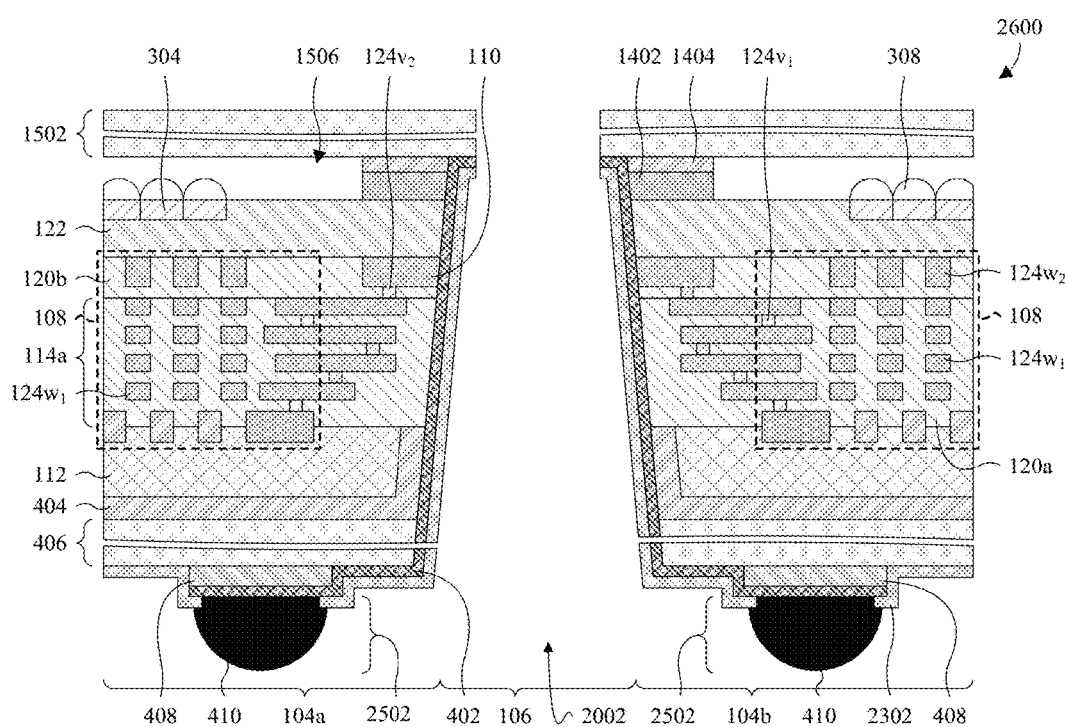

As illustrated by the cross-sectional view 2600 of FIG. 26, the upper insulating plate 1502, the external link 402, and the lower passivation layer 2302 are cut along the scribe line region 106. The cutting separates the upper insulating plate 1502 into a pair of plate segments individual to first and second IC dies 104a, 104b. Similarly, the cutting separates the external link 402 into a pair of external link segments individual to the first and second IC dies 104a, 104b, and separates the lower passivation layer 2302 into a pair of lower passivation segments individual to the first and second IC dies 104a, 104b. The cutting may be, for example, performed by a die saw or some other cutting tool.

Figure 27:
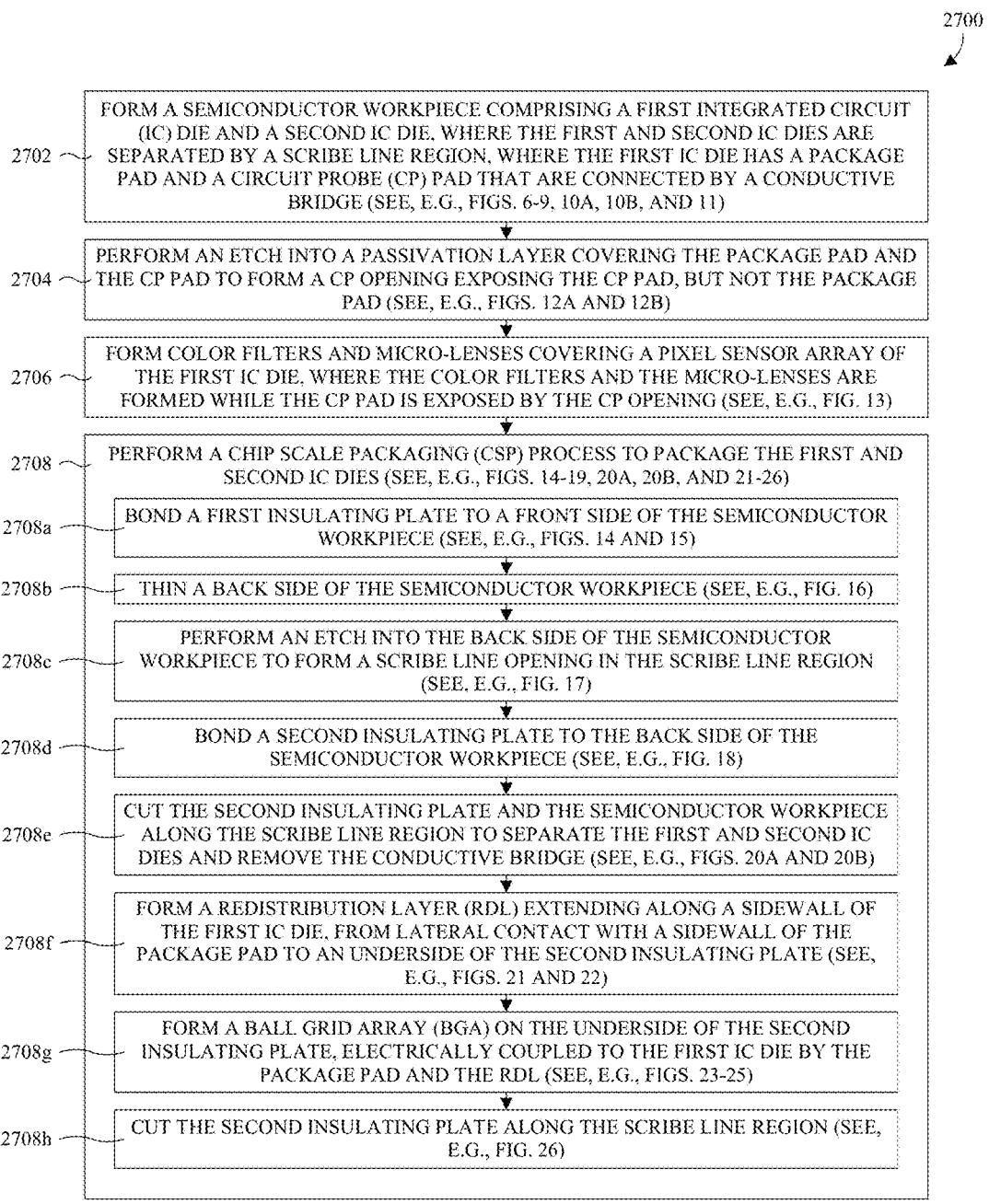
FIG. 27 illustrates a flowchart of some embodiments of the method of FIGS. 6-9, 10A, 10B, 11, 12A, 12B, 13-19, 20A, 20B, and 21-26.

With reference to FIG. 27, a flowchart 2700 of some embodiments of the method of FIGS. 6-9, 10A, 10B, 11, 12A, 12B, 13-19, 20A, 20B, and 21-26 is provided.

At 2702, a semiconductor workpiece comprising a first IC die and a second IC die is formed. The first and second IC dies are separated by a scribe line region. The first IC die has a package pad and a CP pad that are connected by a conductive bridge. See, for example, FIGS. 6-9, 10A, 10B, and 11.

At 2704, an etch is performed into a passivation layer covering the package pad and the CP pad to form a CP opening exposing the CP pad, but not the package pad. See, for example, FIGS. 12A and 12B. In some embodiments, a first round of CP testing is thereafter performed on the first IC die through the CP opening.

At 2706, color filters and micro-lenses are formed covering a pixel sensor array of the first IC die after the etch and, in some embodiments, after the first round of CP testing. The color filters and the micro-lenses are formed while the CP pad is exposed by the CP opening. See, for example, FIG. 13. In some embodiments, a second round of CP testing is thereafter performed on the first IC die through the CP opening.

At 2708, a CSP process is performed to package the first and second IC dies after forming the color filters and the micro-lenses and, in some embodiments, after the second round of CP testing. See, for example, FIGS. 14-19, 20A, 20B, and 21-26.

At 2708a, a first insulating plate is bonded to a front side of the semiconductor workpiece. See, for example, FIGS. 14 and 15. At 2708b, a back side of the semiconductor workpiece is thinned. See, for example, FIG. 16. At 2708c, an etch is performed into the back side of the semiconductor workpiece to form a scribe line opening in the scribe line region. See, for example, FIG. 17. At 2708d, a second insulating plate is bonded to the back side of the semiconductor workpiece. See, for example, FIG. 18. At 2708e, the second insulating plate and the semiconductor workpiece are cut along the scribe line region to separate the first and second IC dies and remove the conductive bridge. See, for example, FIGS. 20A and 20B. At 2708f, a external link is formed extending along a sidewall of the first IC die, from lateral contact with a sidewall of the package pad to an underside of the second insulating plate. See, for example, FIGS. 21 and 22. At 2708g, a BGA is formed on the underside of the second insulating plate, electrically coupled to the first IC die by the package pad and the external link. See, for example, FIGS. 23-25. At 2708h, the second insulating plate is cut along the scribe line region. See, for example, FIG. 26.

The CP pad is used for CP testing after being exposed by the CP opening, while the package pad remains covered by the passivation layer and, hence, free of corrosion and other damage. Further, the cutting separates the CP and package pads, such that the package pad may be used during the CSP process without concern for corrosion and other damage. This may, in turn, may enhance the functionality and the reliability of the first and second IC dies, and may, in turn, enhance bonding performance between the package pad and the external link.

While the flowchart 2700 of FIG. 27 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 28A:
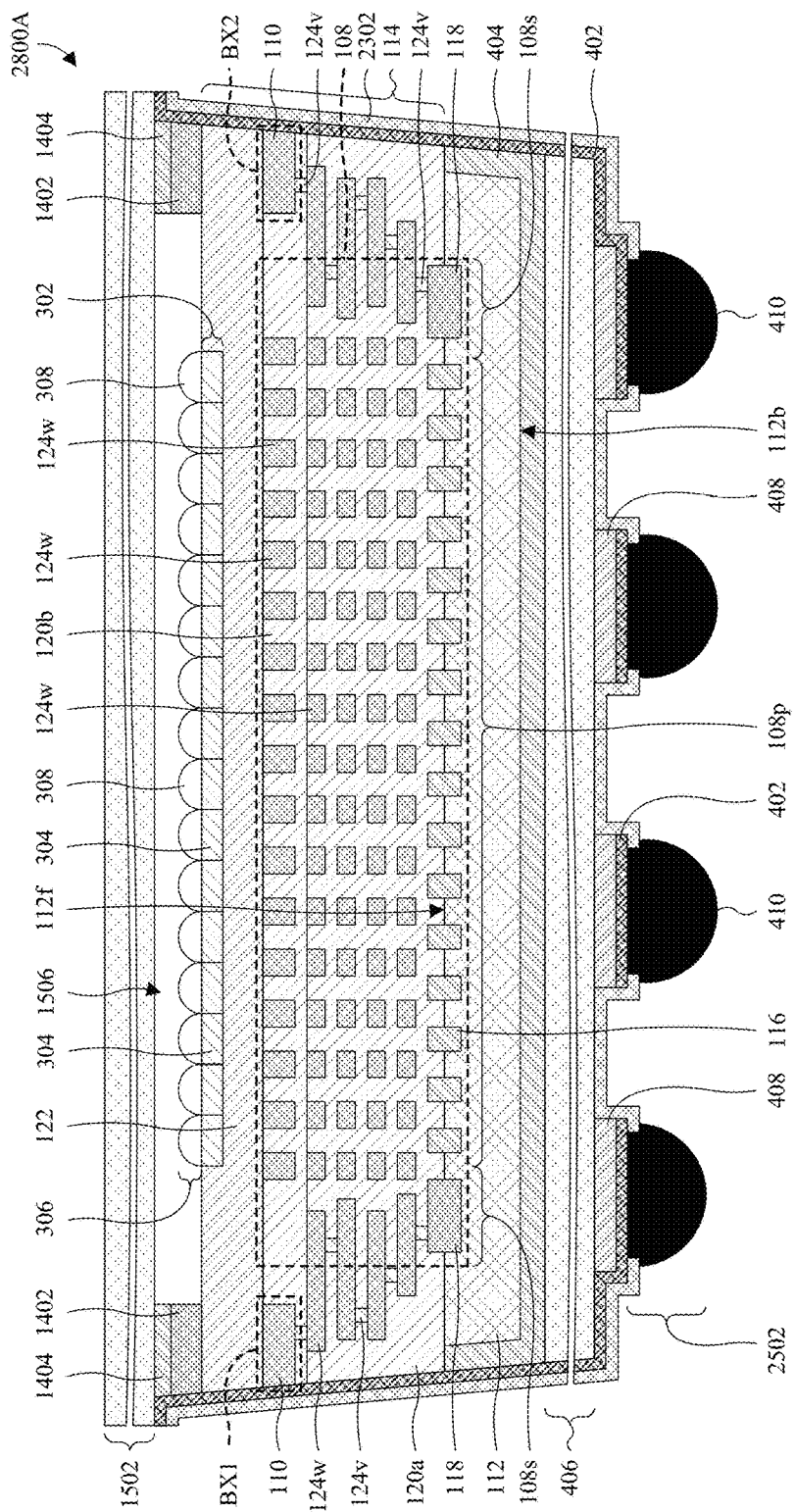

With reference to FIGS. 28A-28C, views 2800A-2800C of some embodiments of the IC package formed according to the method of FIG. 27 is provided. FIG. 28A provides a cross-sectional view 2800A along line A in FIGS. 28B and 28C. FIGS. 28B and 28C provide top views 2800B, 2800C respectively within box BX1 in FIG. 28A and box BX2 in FIG. 28A. As illustrated, a lower insulating plate 406 is bonded to a back side 112b of a semiconductor substrate 112 by a lower adhesive layer 404. In some embodiments, the lower adhesive layer 404 cups the back side 112b of the semiconductor substrate 112, such that the lower adhesive layer 404 lines a bottom surface of the semiconductor substrate 112 and sidewalls of the semiconductor substrate 112.

A BGA 2502 underlies the lower insulating plate 406, on an opposite side of the lower insulating plate 406 as the semiconductor substrate 112. The BGA 2502 comprises a plurality of conductive bumps 410, each vertically spaced from the lower insulating plate 406 by a barrier element 408 and an external link 402. For ease of illustration, only some of the conductive bumps 410 are labeled 410. Further, for ease illustration, the external link 402 and the barrier element 408 are only labeled for some of the conductive bumps 410. The external link 402 is vertically between the barrier element 408 and the corresponding one of the conductive bumps 410, and electrically couples the solder bump to at least one of a plurality of pad structures 110 overlying the semiconductor substrate 112. Further, the external link 402 is lined by a lower passivation layer 2302.

The pad structures 110 are electrically coupled to a circuit 108 on a front side 112f of the semiconductor substrate 112, such that the conductive bumps 410 are electrically coupled to the circuit 108 through the external links 402 and the pad structures 110. The circuit 108 may, for example, be an image sensing circuit or some other circuit. In some embodiments, the circuit 108 comprises a pixel sensor array 108p and supporting circuitry 108s. The pixel sensor array 108p may, for example, comprise a plurality of pixel sensors 116 arranged in rows and columns. For ease of illustration, only one of the pixel sensors 116 is labeled 116. The supporting circuitry 108s supports operation of the pixel sensor array 108p and may comprise, for example, a plurality of supporting devices 118. The supporting devices 118 may include, for example, an ISP, read/write devices, and other supporting devices.

The semiconductor substrate 112 and an interconnect structure 114 at least partially define the circuit 108. The interconnect structure 114 overlies the semiconductor substrate 112, and comprises a lower ILD layer 120a, an upper ILD layer 120b, and an upper passivation layer 122. The upper ILD layer 120b overlies the lower ILD layer 120a, and the upper passivation layer 122 overlies the upper ILD layer 120b. Further, the interconnect structure 114 comprises a plurality of conductive features. The conductive features are stacked within the lower ILD layer 120a, the upper ILD layer 120b, and the upper passivation layer 122 and define conductive paths interconnecting devices of the circuit 108. The conductive features include wires 124w, vias 124v, and the pad structures 110. For ease of illustration, only some of the wires 124w are labeled 124w, and only some of the vias 124v are labeled 124v.

In some embodiments, an array 302 of color filters 304 and an array 306 of micro-lenses 308 are stacked directly over the pixel sensor array 108p. In some embodiments, the color filters 304 are recessed into a top of the upper passivation layer 122, and/or the micro-lenses 308 respectively overlie the color filters 304. The color filters 304 each pass an assigned range of wavelengths (e.g., red wavelengths), while blocking wavelengths outside the assigned range. The color filters 304 may, for example, define a Bayer color filter mosaic. The micro-lenses each focus incident radiation respectively on an underlying one of the pixel sensors 116.

A dam layer 1402 overlies the upper passivation layer 122 and extends laterally along a periphery of the upper passivation layer 122 to laterally surround the circuit 108. In some embodiments, the dam layer 1402 has a ring-shaped layout or some other closed-path layout. Further, an upper insulating plate 1502 overlies and is bonded to the dam layer 1402 by an upper adhesive layer 1404. The upper insulating plate 1502 is transparent and covers the circuit 108. In some embodiments, a cavity 1506 is sealed (e.g., hermetically sealed) between the upper insulating plate 1502 and the upper passivation layer 122.

As illustrated by the top views 2800B, 2800C of FIGS. 28B and 28C, each of the pad structures 110 comprises a first pad 110$f$ and a second pad 110$s$. The first pads 110$f$ have damage 310 due to exposure through CP openings 202 in the upper passivation layer 122 (see FIG. 28A) during formation of the IC package. In some embodiments, the CP openings 202 are filled by the dam layer 1402 (see FIG. 28A) and/or the upper adhesive layer 1404 (see FIG. 28A). Further yet, the first pads 110$f$ are electrically floating and independent of the second pads 110$s$ due to removal of conductive bridges (not shown) of the pad structures 110 during formation of the IC package. The second pads 110$s$ are completely or substantially covered by the upper passivation layer 122 (see FIG. 28A), and hence are devoid of corrosion or other damage. Further, whereas the first pads 110$f$ are electrically floating, the second pads 110$s$ are electrically coupled to the external links 402 and some of the vias 124$v$.

In some embodiments of the present application are directed towards a method for forming an IC package including: forming a semiconductor workpiece including a scribe line region, a first IC die, and a second IC die, wherein the scribe line region separates and adjoins the first and second IC dies, wherein the first IC die includes a circuit and a pad structure electrically coupled to the circuit, wherein the pad structure includes a first pad, a second pad, and a bridge, and wherein the bridge is within the scribe line region and extends from the first pad to the second pad to connect the first pad to the second pad; and cutting the semiconductor workpiece along the scribe line region to individualize the first and second IC dies, wherein the cutting removes the bridge to separate the first and second pads. In some embodiments, the semiconductor workpiece includes a passivation layer covering the first pad and the second pad, wherein the method further includes performing an etch into the passivation layer to form an opening exposing the first pad, but not the second pad, and wherein the cutting is performed while the second pad is completely covered by the passivation layer. In some embodiments, the method further includes performing CP testing on the circuit using the first pad through the opening. In some embodiments, the first IC die further includes an array of pixel sensors, wherein the method further includes: forming an array of color filters overlying the array of pixel sensors and recessed into a top of the passivation layer; and forming an array of micro-lenses overlying the array of color filters. In some embodiments, the method further includes: performing a first round of CP testing on the circuit using the first pad through the opening, wherein the first round of CP testing is performed between the performing of the etch and the forming of the array of color filters; and performing a second round of CP testing on the circuit using the first pad through the opening, wherein the second round of CP testing is performed between the forming of the array of micro-lenses and the cutting of the semiconductor workpiece. In some embodiments, the method further includes forming corrosion on the first pad between the performing of the etch and the cutting of the semiconductor workpiece, wherein the corrosion forms on the first pad through the opening, and wherein the second pad is substantially free of corrosion during the cutting of the semiconductor workpiece. In some embodiments, the first pad is formed electrically coupled to the circuit through the second pad and the bridge, wherein the first pad is electrically floating upon completion of the cutting. In some embodiments, the pad structure has a U-shaped layout before the cutting. In some embodiments, the method further includes: after the cutting, forming an external link extending along a sidewall of the first IC die, from lateral contact with a sidewall of the second pad to an underside of the first IC die; and forming a solder bump on the underside of the first IC die, wherein the solder bump is electrically coupled to the circuit through the second pad and the external link.

In some embodiments of the present application are directed towards an IC package including: an IC die including a circuit, a first pad, a second pad, and a passivation layer, wherein the passivation layer covers the second pad and defines an opening overlying the first pad, wherein the first pad is electrically floating and has a top surface that is damaged, wherein the second pad is electrically coupled to the circuit and has a top surface substantially free of damage, and wherein the first pad, the second pad, and the passivation layer partially define a common sidewall of the IC die; and an external link extending from a bottom of the IC die, along the common sidewall, to lateral contact with the second pad. In some embodiments, the IC die further includes a pixel sensor array, wherein the IC package further includes: an array of color filters overlying the pixel sensor array and recessed into a top of the passivation layer; and an array of micro-lenses overlying the array of color filters. In some embodiments, the IC further includes: an adhesive layer overlying the passivation layer and partially defining the common sidewall; and a transparent plate covering the micro-lenses and the passivation layer, and further adhered to the passivation layer through the adhesive layer. In some embodiments, the IC further includes: a semiconductor substrate; and an interconnect structure overlying the semiconductor substrate, wherein the interconnect structure includes an ILD layer, a plurality of wires, and a plurality of vias, wherein the wires and the vias are alternatingly stacked within the ILD layer, wherein the passivation layer covers the ILD layer, wherein the circuit is at least partially defined by the semiconductor substrate and the interconnect structure, and wherein the ILD layer partially defines the common sidewall. In some embodiments, the external link laterally contacts the ILD layer, the passivation layer, and the second pad at the common sidewall. In some embodiments, the IC further includes: an adhesive layer cupping an underside of the semiconductor substrate, such that the adhesive layer lines sidewalls of the semiconductor substrate, wherein the adhesive layer partially defines the common sidewall; and an insulating plate adhered to the underside of the semiconductor substrate through the adhesive layer, wherein the external link extends from an underside of the insulating plate to the second pad. In some embodiments, the IC further includes a BGA on the underside of the insulating plate, wherein the external link extends from the second pad to the BGA and electrically couples the BGA to the second pad.

In some embodiments of the present application are directed towards another method for forming an IC package including: forming a semiconductor workpiece including a scribe line region, a first IC die, and a second IC die, wherein the scribe line region separates and adjoins the first and second IC dies, wherein the first IC die includes a circuit; forming a U-shaped pad structure on the first IC die, wherein the U-shaped pad structure includes a first pad, a second pad, and a bridge, wherein the bridge is within the scribe line region and extends from the first pad to the second pad to connect the first and second pads, and wherein the first pad is electrically coupled to the circuit through the bridge and the second pad; forming a passivation layer covering the semiconductor workpiece and the U-shaped pad structure; performing an etch into the passivation layer to form a CP opening exposing the first pad, but not the second pad; performing a first round of CP testing on the circuit using the first pad through the CP opening; forming an array of color filters overlying the circuit and the passivation layer; forming an array of micro-lenses overlying the array of color filters; performing a second round of CP testing on the circuit using the first pad through the CP opening; cutting the semiconductor workpiece along the scribe line region to individualize the first and second IC dies, wherein the cutting removes the bridge to separate the first and second pads, and wherein the first pad is electrically floating upon completion of the cutting; and forming an external link extending along a sidewall of the first IC die, from lateral contact with a sidewall of the second pad to an underside of the first IC die. In some embodiments, the method further includes forming corrosion on the first pad between the performing of the etch and the cutting, wherein the second pad is free of corrosion at the cutting. In some embodiments, the forming of the semiconductor workpiece includes: forming semiconductor devices in a top of a semiconductor substrate; and forming an interconnect structure covering the semiconductor devices and the semiconductor substrate, wherein the interconnect structure includes a lower ILD layer, a plurality of wires, and a plurality of vias, wherein the wires and the vias are alternatingly stacked in the lower ILD layer, and wherein the semiconductor devices and the interconnect structure at least partially define the circuit. In some embodiments, the forming of the pad structure includes: forming an upper ILD layer covering the lower ILD layer; patterning the upper ILD layer to define feature openings in the upper ILD layer with a layout of the pad structure; forming a conductive layer filling the feature openings and covering the upper ILD layer; and performing a planarization into the conductive layer to about even with a top surface of the upper ILD layer to form the pad structure from the conductive layer, wherein the pad structure is electrically coupled to the semiconductor devices through the wires and the vias.

In some embodiments of the present application are directed towards another IC package including: a semiconductor substrate; semiconductor devices in a top of the semiconductor substrate; an interconnect structure covering the semiconductor devices and the semiconductor substrate, wherein the interconnect structure includes an ILD layer, a plurality of vias, and a plurality of wires, wherein the vias and the wires are alternatingly stacked in the ILD layer; a first pad and a second pad on the ILD layer, wherein the first pad is electrically floating and has a top surface that is corroded, wherein the second pad is electrically coupled to at least one of the semiconductor devices by the vias and the wires, and wherein the first pad, the second pad, and the ILD layer partially define a common sidewall; a passivation layer completely covering the second pad and partially defining the common sidewall; and an external link extending along the common sidewall, from lateral contact with the second pad to an underside of the semiconductor substrate. In some embodiments, the IC package further includes a BGA on the underside of the semiconductor substrate, wherein the BGA is electrically coupled to the semiconductor devices through the external link and the second pad. In some embodiments, the IC package further includes: an adhesive layer cupping the underside of the semiconductor substrate, such that the adhesive layer lines a bottom surface of the semiconductor substrate and sidewalls of the semiconductor substrate; and an insulating plate adhered to the underside of the semiconductor substrate through the adhesive layer, wherein the insulating plate and the adhesive layer partially define the common sidewall, and wherein the BGA is under the insulating plate. In some embodiments, the semiconductor devices include a plurality of pixel sensors defining a pixel sensor array, wherein the IC package further includes a plurality of color filters overlying the passivation layer and the pixel sensor array, and wherein the color filters are recessed into a top of the passivation layer. In some embodiments, the IC package further includes: an adhesive layer overlying the passivation layer and extending laterally along a perimeter of the passivation layer to enclose the color filters; and a transparent plate overlying the passivation layer and the color filters, wherein the transparent plate is adhered to the passivation layer by the adhesive layer. In some embodiments, the transparent plate, the passivation layer, and the adhesive layer at least partially define a hermetically cavity around the color filters. In some embodiments, the IC package further includes a third pad and a fourth pad on the ILD layer, wherein the third pad is electrically floating and has a top surface that is corroded, wherein the fourth pad is electrically coupled to the semiconductor devices by the vias and the wires, wherein the third pad, the fourth pad, the ILD layer, and the passivation layer partially define a second common sidewall, and wherein the second common sidewall and the common sidewall are on opposite sides of the interconnect structure.

In some embodiments of the present application are directed towards yet another IC package including: a semiconductor substrate; a plurality of semiconductor devices in a top of the semiconductor substrate; a lower adhesive layer cupping an underside of the semiconductor substrate, such that the lower adhesive layer lines a bottom surface of the semiconductor substrate and sidewalls of the semiconductor substrate; a lower insulating plate adhered to the underside of the semiconductor substrate through the lower adhesive layer; a BGA on an underside of the lower insulating plate; an interconnect structure covering the semiconductor devices and the semiconductor substrate, wherein the interconnect structure includes an ILD layer, a plurality of vias, and a plurality of wires, wherein the vias and the wires are alternatingly stacked in the ILD layer; a passivation layer covering the interconnect structure; a first pad and a second pad both overlying the interconnect structure, between the interconnect structure and the passivation layer, wherein the first pad is electrically floating and has a top surface that is corroded, wherein the second pad is electrically coupled to at least one of the semiconductor devices by the vias and the wires and has a top surface free of corrosion, and wherein the first pad, the second pad, the ILD layer, the passivation layer, the lower adhesive layer, and the lower insulating plate partially define a common sidewall; and an external link extending along the common sidewall, from laterally contact with the second pad to the BGA. In some embodiments, the IC package further includes: a color filter array overlying the passivation layer and recessed into a top of the passivation layer; a micro-lens array overlying the color filter array; an upper adhesive layer overlying the passivation layer and extending laterally around the color filter array, wherein the upper adhesive layer partially defines the common sidewall; and an upper insulating plate covering the micro-lenses and the passivation layer, and wherein the upper insulating plate is adhered to the passivation layer by the upper adhesive layer. In some embodiments, the upper adhesive layer, the passivation layer, and the upper insulating plate define a hermetically sealed cavity around the micro-lens array. In some embodiments, the BGA includes a plurality of conductive bumps, wherein the IC package further includes a plurality of barrier elements on the underside of the lower insulating plate, wherein the barrier elements respectively space the conductive bumps from the lower insulating plate, and wherein the external link is directly between one of the conductive bumps and one of the barrier elements.

In some embodiments of the present application are directed towards yet another method for forming an IC package including: forming a semiconductor workpiece including a scribe line region, a first IC die, and a second IC die, wherein the scribe line region separates and adjoins the first and second IC dies, wherein the first IC die includes a circuit and a pad structure electrically coupled to the circuit, wherein the pad structure includes a first pad, a second pad, and a bridge, and wherein the bridge is within the scribe line region and extends from the first pad to the second pad to connect the first pad to the second pad; forming an upper adhesive layer overlying semiconductor workpiece, on the scribe line region; bonding an upper insulating plate to a top of the semiconductor workpiece through the upper adhesive layer; performing an etch into a bottom of the semiconductor workpiece to form a scribe line opening in the scribe line region; forming a lower adhesive layer lining the bottom of the semiconductor workpiece and filling the scribe line opening; bonding a lower insulating plate to the bottom of the semiconductor workpiece through the lower adhesive layer; cutting the lower insulating plate, the lower adhesive layer, the semiconductor workpiece, the pad structure, and the upper adhesive layer, but not the upper insulating plate, along the scribe line region to define a notch separating the first IC die and the second IC die, wherein the cutting of the pad structure removes the bridge to separate the first and second pads; forming an external link lining the notch and extending from lateral contact with a sidewall of the second pad to an underside of the lower insulating plate; and cutting the external link and the upper insulating plate along the scribe line region. In some embodiments, the first IC die further includes an array of pixel sensors, wherein the method further includes: forming an array of color filters overlying the array of pixel sensors and recessed into the top of the semiconductor workpiece; and forming an array of micro-lenses overlying the array of color filters, wherein the upper insulating plate is transparent and covers the array of micro-lenses. In some embodiments, the pad structure has a U-shaped layout before the cutting of the pad structure. In some embodiments, the first pad is electrically coupled to the circuit before the cutting of the pad structure, wherein the first pad is electrically floating upon completing the cutting of the pad structure. In some embodiments, the semiconductor workpiece includes a passivation layer covering the first and second pads, wherein the method further includes performing a second etch into the passivation layer to form an opening exposing the first pad, but not the second pad, and wherein the cutting of the pad structure is performed while the second pad is covered by the passivation layer. In some embodiments, the method further includes performing CP testing on the circuit using the first pad through the opening. In some embodiments, the method further includes forming corrosion or damage on the first pad through the opening between the performing of the second etch and the cutting of the semiconductor workpiece. In some embodiments, the forming of the semiconductor workpiece includes: forming semiconductor devices in a semiconductor substrate of the semiconductor workpiece; forming an interconnect structure covering the semiconductor devices and the semiconductor substrate, wherein the interconnect structures includes an ILD layer, a plurality of wires, and a plurality of vias, and wherein the wires and the vias are alternatively stacked in the ILD layer; forming the pad structure on the interconnect structure; and forming a passivation layer covering the pad structure and the interconnect structure, wherein the upper adhesive layer is formed on the passivation layer. In some embodiments, the method further includes forming a BGA on the underside of the lower insulating plate, wherein the external link electrically couples the BGA to the second pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit (IC) package, the method comprising:
    forming a semiconductor workpiece comprising a scribe line region, a first IC die, and a second IC die, wherein the scribe line region separates and adjoins the first and second IC dies, wherein the first IC die comprises a circuit and a pad structure electrically coupled to the circuit, wherein the pad structure comprises a first pad, a second pad, and a bridge, and wherein the bridge is within the scribe line region and extends from the first pad to the second pad to connect the first pad to the second pad; and
    cutting the semiconductor workpiece along the scribe line region to individualize the first and second IC dies, wherein the cutting removes the bridge to separate the first and second pads.

2. The method according to claim 1, wherein the semiconductor workpiece comprises a passivation layer covering the first pad and the second pad, and wherein the method further comprises:
    performing an etch into the passivation layer to form an opening exposing the first pad, but not the second pad, and wherein the cutting is performed while the second pad is completely covered by the passivation layer.

3. The method according to claim 2, further comprising:
    performing circuit probe (CP) testing on the circuit using the first pad through the opening.

4. The method according to claim 2, wherein the first IC die further comprises an array of pixel sensors, and wherein the method further comprises:

forming an array of color filters overlying the array of pixel sensors and recessed into a top of the passivation layer; and forming an array of micro-lenses overlying the array of color filters.

5. The method according to claim 4, further comprising:

performing a first round of circuit probe (CP) testing on the circuit using the first pad through the opening, wherein the first round of CP testing is performed between the performing of the etch and the forming the array of color filters; and performing a second round of CP testing on the circuit using the first pad through the opening, wherein the second round of CP testing is performed between the forming of the array of micro-lenses and the cutting of the semiconductor workpiece.

6. The method according to claim 2, further comprising:

forming corrosion on the first pad between the performing of the etch and the cutting of the semiconductor workpiece, wherein the corrosion forms on the first pad through the opening, and wherein the second pad is substantially free of corrosion during the cutting of the semiconductor workpiece.

7. The method according to claim 1, wherein the first pad is formed electrically coupled to the circuit through the second pad and the bridge, and wherein the first pad is electrically floating upon completion of the cutting.

8. The method according to claim 1, wherein the pad structure has a U-shaped layout before the cutting.

9. The method according to claim 1, further comprising:

after the cutting, forming an external link extending along a sidewall of the first IC die, from lateral contact with a sidewall of the second pad to an underside of the first IC die; and forming a solder bump on the underside of the first IC die, wherein the solder bump is electrically coupled to the circuit through the second pad and the external link.

10. A method for forming an integrated circuit (IC) package, the method comprising:

forming a semiconductor workpiece comprising a scribe line region, a first IC die, and a second IC die, wherein the scribe line region separates and adjoins the first and second IC dies, and wherein the first IC die comprises a circuit;

forming a U-shaped pad structure on the first IC die, wherein the U-shaped pad structure comprises a first pad, a second pad, and a bridge, wherein the bridge is within the scribe line region and extends from the first pad to the second pad to connect the first and second pads, and wherein the first pad is electrically coupled to the circuit through the bridge and the second pad;

forming a passivation layer covering the semiconductor workpiece and the U-shaped pad structure;

performing an etch into the passivation layer to form a circuit probe (CP) opening exposing the first pad, but not the second pad;

performing a first round of CP testing on the circuit using the first pad through the CP opening;

forming an array of color filters overlying the circuit and the passivation layer;

forming an array of micro-lenses overlying the array of color filters;

performing a second round of CP testing on the circuit using the first pad through the CP opening;

cutting the semiconductor workpiece along the scribe line region to individualize the first and second IC dies, wherein the cutting removes the bridge to separate the first and second pads, and wherein the first pad is electrically floating upon completion of the cutting; and forming an external link extending along a sidewall of the first IC die, from lateral contact with a sidewall of the second pad to an underside of the first IC die.

11. The method according to claim 10, further comprising:

forming corrosion on the first pad between the performing of the etch and the cutting, wherein the second pad is free of corrosion at the cutting.

12. The method according to claim 10, wherein the forming of the semiconductor workpiece comprises:

forming semiconductor devices in a top of a semiconductor substrate; and forming an interconnect structure covering the semiconductor devices and the semiconductor substrate, wherein the interconnect structure comprises a lower interlayer dielectric (ILD) layer, a plurality of wires, and a plurality of vias, wherein the wires and the vias are alternatingly stacked in the lower ILD layer, and wherein the semiconductor devices and the interconnect structure at least partially define the circuit.

13. The method according to claim 12, wherein the forming of the U-shaped pad structure comprises:

forming an upper ILD layer covering the lower ILD layer;

patterning the upper ILD layer to define feature openings in the upper ILD layer with a layout of the U-shaped pad structure;

forming a conductive layer filling the feature openings and covering the upper ILD layer; and performing a planarization into the conductive layer to about even with a top surface of the upper ILD layer to form the U-shaped pad structure from the conductive layer, wherein the U-shaped pad structure is electrically coupled to the semiconductor devices through the wires and the vias.

14. A method for forming an integrated circuit (IC) package, the method comprising:

forming a semiconductor device on a semiconductor substrate, wherein the semiconductor substrate has an IC die region and a scribe-line region, and wherein the semiconductor device is at the IC die region;

forming an interconnect structure on the semiconductor substrate, wherein the interconnect structure comprises a plurality of wires, a plurality of vias, and a pad structure, wherein the wires and the vias are alternatingly stacked and define a conductive path from the pad structure to the semiconductor device, wherein the pad structure comprises a first pad, a second pad, and a bridge, wherein the first and second pads overlie the IC die region, and wherein the bridge overlies the scribe-line region and extends from the first pad to the second pad; and cutting the semiconductor substrate along the scribe-line region to remove the bridge and to separate the first and second pads.

15. The method according to claim 14, further comprising:

forming a passivation layer covering the first and second pads; and patterning the passivation layer to uncover the first pad, but not the second pad.

16. The method according to claim 15, further comprising:

forming microlenses on the passivation layer, and overlying the IC die region, before the cutting.

17. The method according to claim 14, further comprising:
forming a conductive wire extending from a sidewall of the second pad to a bottom surface of the semiconductor substrate, wherein the conductive wire wraps around a bottom corner of the semiconductor substrate.

18. The method according to claim 14, wherein the interconnect structure comprises a second pad structure, wherein the second pad structure comprises a third pad, a fourth pad, and a second bridge, wherein the third and fourth pads overlie the IC die region, and wherein the second bridge overlies the scribe-line region and extends from the third pad to the fourth pad.

19. The method according to claim 17, wherein the scribe line region extends in a closed path along a boundary of the IC die region to completely surround the IC die region.

20. The method according to claim 14, wherein the first pad is electrically coupled to the semiconductor device through the bridge.

* * * * *